(12) United States Patent
Okajima

(10) Patent No.: US 9,570,392 B2
(45) Date of Patent: Feb. 14, 2017

(54) MEMORY DEVICE AND METHOD FOR MANUFACTURING THE SAME

(71) Applicant: Kabushiki Kaisha Toshiba, Minato-ku (JP)

(72) Inventor: Mutsumi Okajima, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/835,925

(22) Filed: Aug. 26, 2015

(65) Prior Publication Data
US 2016/0322302 A1    Nov. 3, 2016

Related U.S. Application Data

(60) Provisional application No. 62/154,947, filed on Apr. 30, 2015.

(51) Int. Cl.
*H01L 23/528*    (2006.01)
*H01L 23/522*    (2006.01)
(Continued)

(52) U.S. Cl.
CPC ....... *H01L 23/5283* (2013.01); *H01L 21/0217* (2013.01); *H01L 21/02164* (2013.01); *H01L 21/76801* (2013.01); *H01L 21/76805* (2013.01); *H01L 21/76831* (2013.01); *H01L 21/76877* (2013.01); *H01L 23/5226* (2013.01);
(Continued)

(58) Field of Classification Search
CPC ............ H01L 21/1158; H01L 21/76801; H01L 21/76877; H01L 23/5283; H01L 23/5226; H01L 23/53295; H01L 27/1158
See application file for complete search history.

(56) References Cited

U.S. PATENT DOCUMENTS 8,044,456 B2    10/2011  Nagashima et al.
8,765,598 B2 *   7/2014  Smith ............... H01L 27/11548
                                              257/700
(Continued)

FOREIGN PATENT DOCUMENTS

| JP | 2010-45205 A | 2/2010 |
|---|---|---|
| JP | 2011-35343 A | 2/2011 |
| JP | 2012-197255 A | 10/2012 |
| JP | 2013-131580 A | 7/2013 |

*Primary Examiner* — Joseph C Nicely
(74) *Attorney, Agent, or Firm* — Oblon, McClelland, Maier & Neustadt, L.L.P.

(57) ABSTRACT

According to one embodiment, a memory device includes a conductive member and a stacked body provided on the conductive member. The stacked body includes a plurality of first interconnections being stacked to be separated from each other, a memory cell connected with one of the first interconnections, a plurality of contact plugs, an insulating member. Each of the contact plugs connects each of the first interconnections with an upper surface of the conductive member. One of the contact plugs includes an upper part, and a lower part. The lower part is provided between the upper part and the conductive member. The lower part includes a first portion and a second portion. The first portion is connected with one of the first interconnections. The second portion is connected with the conductive member. The insulating member is provided between the first portion and the second portion.

20 Claims, 32 Drawing Sheets

(51) Int. Cl.
*H01L 27/115* (2006.01)
*H01L 23/532* (2006.01)
*H01L 21/768* (2006.01)
*H01L 21/02* (2006.01)

(52) U.S. Cl.
CPC .... *H01L 23/53295* (2013.01); *H01L 27/1158* (2013.01); *H01L 27/11553* (2013.01)

(56) References Cited

U.S. PATENT DOCUMENTS

| | | |
|---|---|---|
| 8,896,051 B2 | 11/2014 | Nansei et al. |
| 8,912,060 B2 | 12/2014 | Uenaka et al. |
| 2009/0242968 A1* | 10/2009 | Maeda ............... H01L 27/11551 257/324 |
| 2010/0207186 A1* | 8/2010 | Higashi ............ H01L 27/11582 257/314 |
| 2010/0213526 A1* | 8/2010 | Wada ................ H01L 21/76808 257/314 |
| 2011/0031630 A1* | 2/2011 | Hashimoto ....... H01L 27/11578 257/774 |
| 2013/0056818 A1* | 3/2013 | Iino .................... H01L 27/1157 257/324 |
| 2013/0187118 A1 | 7/2013 | Murooka |
| 2013/0270714 A1* | 10/2013 | Lee .................. H01L 21/76802 257/774 |
| 2014/0112876 A1 | 4/2014 | Eguchi et al. |
| 2016/0071908 A1 | 3/2016 | Murooka |

\* cited by examiner

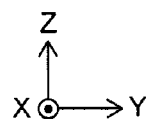
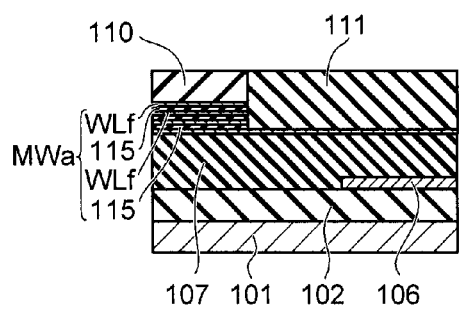
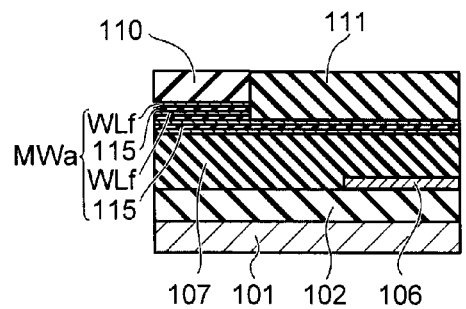
FIG. 10A          FIG. 10B
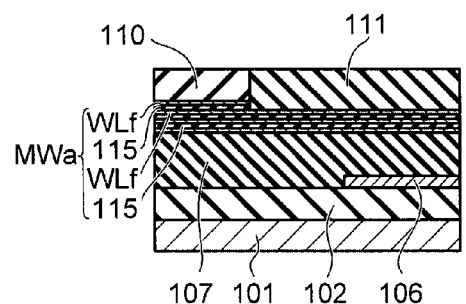
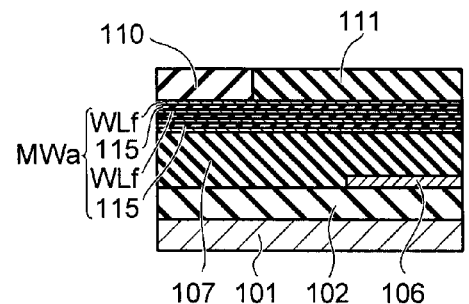
FIG. 10C          FIG. 10D

MEMORY DEVICE AND METHOD FOR MANUFACTURING THE SAME

CROSS-REFERENCE TO RELATED APPLICATION

This application is based upon and claims the benefit of priority from U.S. Provisional Patent Application 62/154,947, filed on Apr. 30, 2015; the entire contents of which are incorporated herein by reference.

FIELD

Embodiments described herein relate generally to a memory device.

BACKGROUND

In recent years, a memory device is proposed in which memory cells are three-dimensionally stacked so that the integration efficiency of the memory cells is improved. As such a memory device, a three-dimensional cross-point memory device can be cited in which memory cells are connected between alternately stacked word lines and bit lines. Besides, a three-dimensional stacked flash memory is also developed which includes charge holding films as memory cells between a stacked body in which insulating films and electrode films are alternately stacked and a semiconductor pillar passing through the stacked body. In the memory device as stated above, reduction in chip size and reduction in manufacturing cost are demanded.

BRIEF DESCRIPTION OF THE DRAWINGS

FIG. 6A to FIG. 18D are schematic views exemplifying the method for manufacturing the memory device of the first embodiment;

DETAILED DESCRIPTION

According to one embodiment, a memory device includes a conductive member and a stacked body provided on the conductive member. The stacked body includes a plurality of first interconnections being stacked to be separated from each other, a memory cell connected with one of the first interconnections, a plurality of contact plugs, and an insulating member. Each of the contact plugs connects each of the first interconnections with an upper surface of the conductive member. One of the contact plugs includes an upper part, and a lower part. The lower part is provided between the upper part and the conductive member. The lower part includes a first portion and a second portion. The first portion is connected with one of the first interconnections. The second portion is connected with the conductive member. The insulating member is provided between the first portion and the second portion.

First Embodiment

First, a first embodiment will be described.

Figure 1:
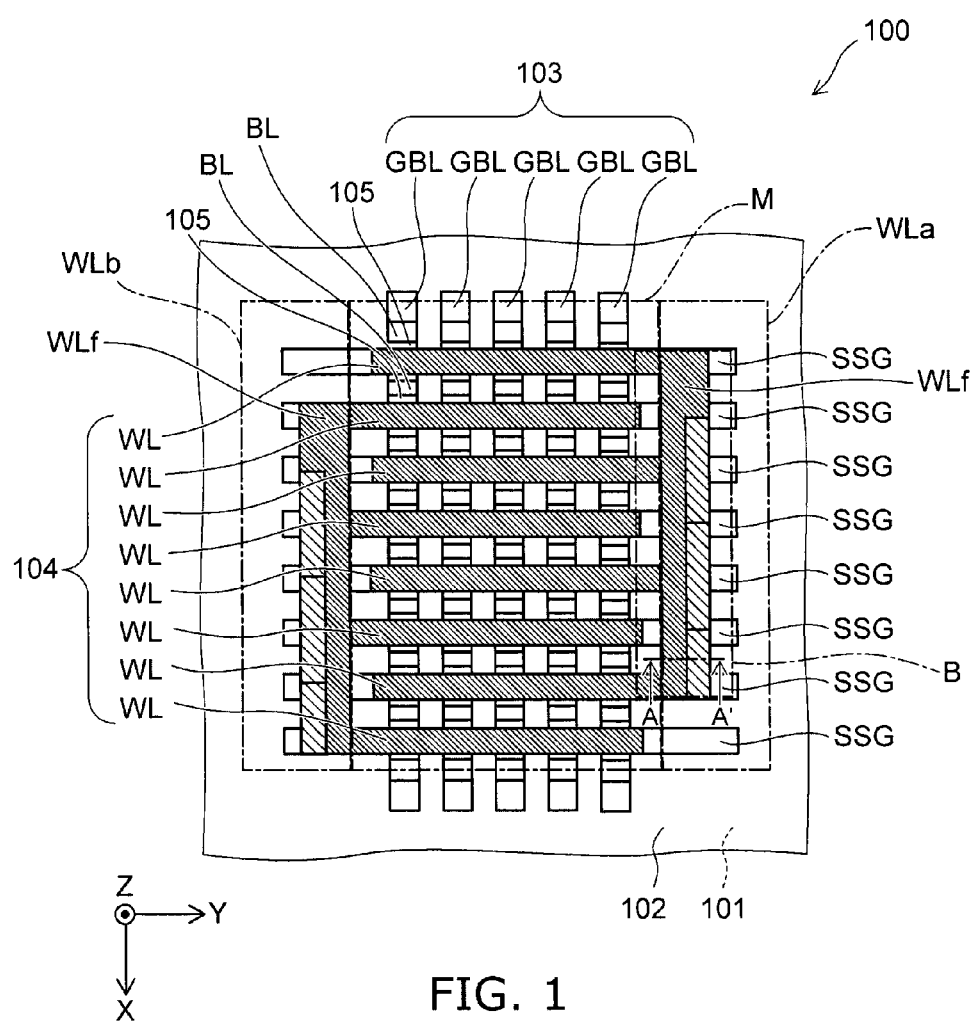
FIG. 1 is a plan view of a memory device of a first embodiment.

FIG. 1 is a plan view of a memory device of this embodiment.

As shown in FIG. 1, in a memory device 100 of this embodiment, a silicon substrate 101 is provided. Besides, a drive circuit (not shown) of the memory device 100 is provided in an upper layer portion of the silicon substrate 101 and on an upper surface thereof. An interlayer insulating film 102 in which the drive circuit is embedded is provided on the silicon substrate 101. The interlayer insulating film 102 contains, for example, an insulating material such as silicon oxide.

Hereinafter, in the specification, an XYZ orthogonal coordinate system is introduced for convenience of explanation. In the coordinate system, two directions parallel to an upper surface of the silicon substrate 101 and perpendicular to each other are "X-direction" and "Y-direction", and a direction perpendicular to both the X-direction and the Y-direction is "Z-direction".

A memory area M is provided on the silicon substrate 101. When viewed from the Z-direction, the shape of the memory area M is, for example, square. When viewed from the memory area M, two word line lead-out areas WLa and WLb are provided on both sides in the Y-direction.

First, the configuration of the memory area M will be described.

Figure 2:
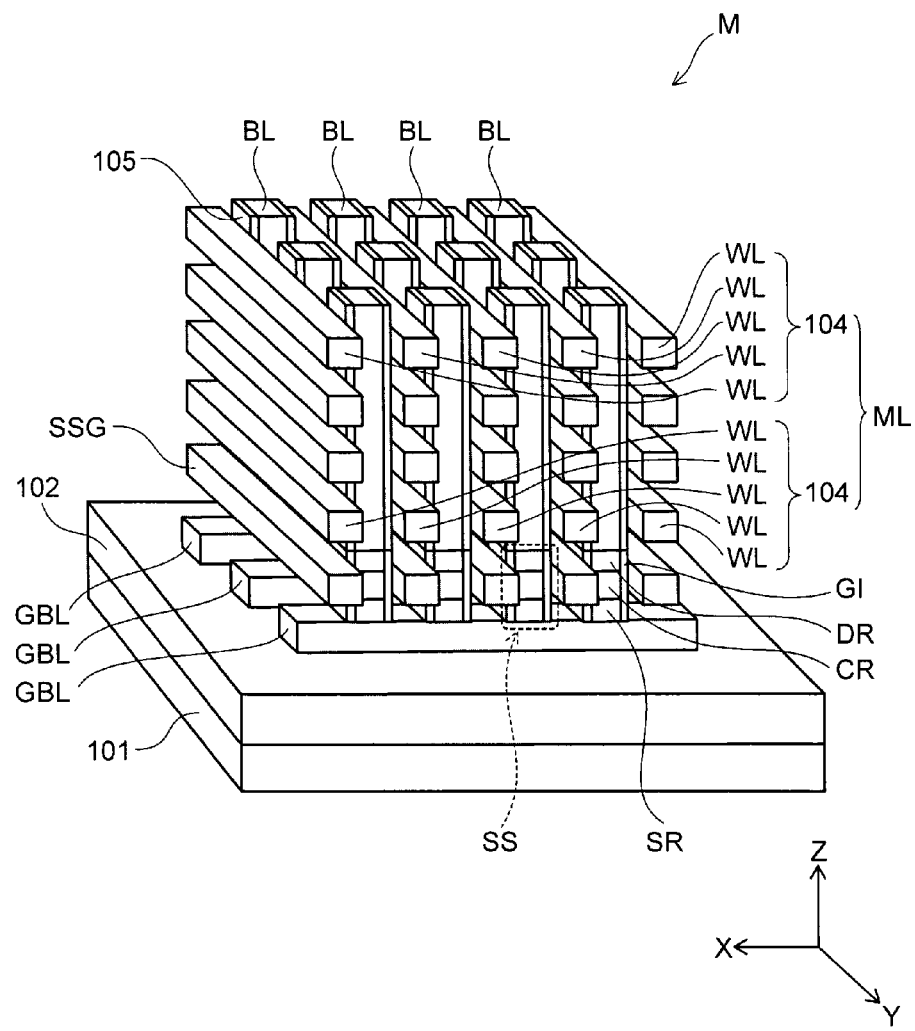
FIG. 2 is a perspective view exemplifying a part of the memory area of the memory device of the first embodiment.

FIG. 2 is a perspective view exemplifying a part of the memory area of the memory device of the embodiment.

As shown in FIG. 1 and FIG. 2, in the memory area M of the memory device 100, a lower layer bit line interconnection layer 103 including plural lower layer bit lines GBL and extending in the X-direction is provided on the interlayer insulating film 102. Plural selection gate electrodes SSG extending in the Y-direction are provided on the lower layer bit lines GBL. Besides, a word line interconnection layer 104 including plural word lines WL extending in the Y-direction is provided on the selection gate electrodes SSG. A plurality of the word line interconnection layers 104 are provided, and are stacked to be separated from each other.

By this, the word line interconnection layers 104 form a stacked body ML. The word lines WL included in the same word line interconnection layer 104 are connected to a common electrode film WLf every other piece in sequence from the X-direction, and the word lines WL are branched into a comb shape from the electrode film WLf. At this time, when counted in the X-direction, the odd-numbered word lines WL are connected to the plate-like electrode film WLf provided in the word line lead-out area WLa, and the even-numbered word lines WL are connected to the electrode film WLf provided in the word line lead-out area WLb. Columnar bit lines BL extending in the Z-direction are provided just above the lower layer bit lines GBL and are respectively provided between the two adjacent word lines WL. The respective bit lines BL between the two adjacent word lines WL are provided to be separated from each other. Besides, a memory film 105 is provided between the word line WL and the bit line BL. The memory film 105 is provided with a resistance change film such as a metal oxide film or a stacked film of a silicon layer and a silver layer. By this, the memory film 105 functions as a resistance change type memory cell. Besides, the bit lines BL extending in the Z-direction are provided just above the lower layer bit lines GBL and on side surfaces of the word lines WL at the outermost periphery of the memory area M.

As shown in FIG. 2, a selection element SS is provided between the lower layer bit line GBL and the bit line BL and between the two adjacent selection gate electrodes SSG. The one selection element SS is connected to the one bit line BL. The respective selection elements SS are separated from each other. The selection element SS includes a source region SR provided on the lower layer bit line GBL, a silicon layer CR as a channel region provided on the source region SR, and a drain region DR provided on the silicon layer CR. Besides, a gate insulating film GI is provided between the selection gate electrode SSG and the selection element SS.

Incidentally, for simplification of the drawings, in FIG. 1 and FIG. 2, among the components of the memory device 100, components other than the silicon substrate 101, the interlayer insulating film 102, the lower layer bit lines GBL, the bit lines BL, the selection elements SS, the electrode films WLf, the word lines WL and the memory films 105 are omitted.

Next, a relation between the memory area M and the word line lead-out area WLa will be described.

Hereinafter, although the word line lead-out area WLa will be exemplified, the configuration of the word line lead-out area WLb is also the same.

Figure 3:
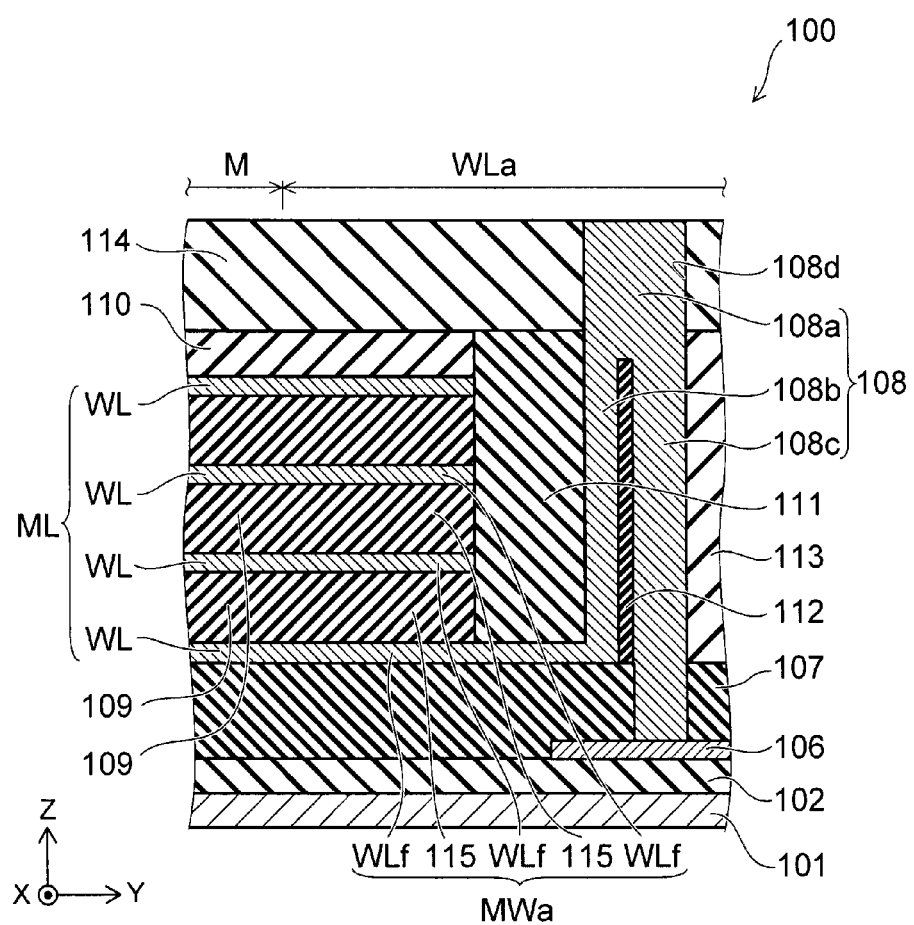
FIG. 3 is a sectional view taken along line A-A' shown in FIG. 1.

FIG. 3 is a sectional view taken along line A-A' shown in FIG. 1.

Figure 4:
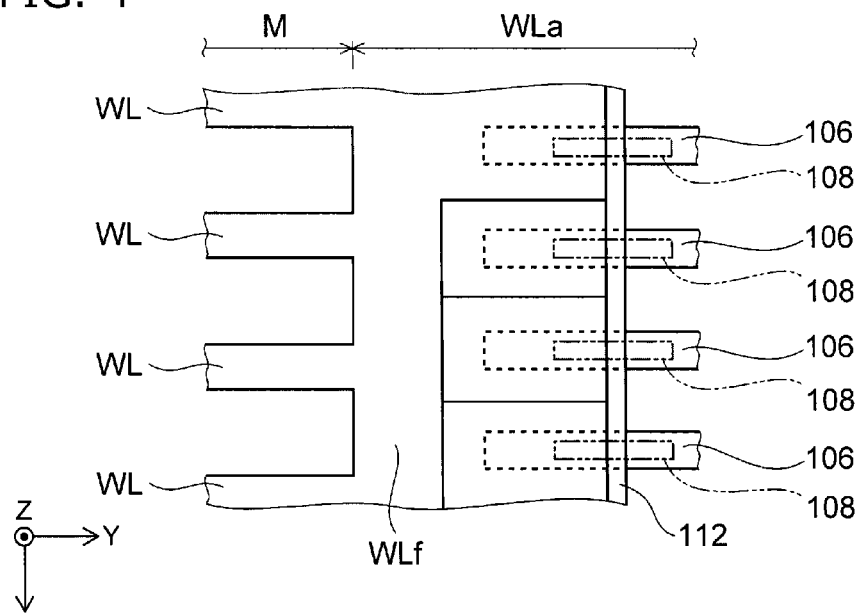
FIG. 4 is a plan view exemplifying the shape of the word line interconnection layer and the electrode film in an area B shown in FIG. 1.

FIG. 4 is a plan view exemplifying the shape of the word line interconnection layer and the electrode film in an area B shown in FIG. 1.

Figure 5:
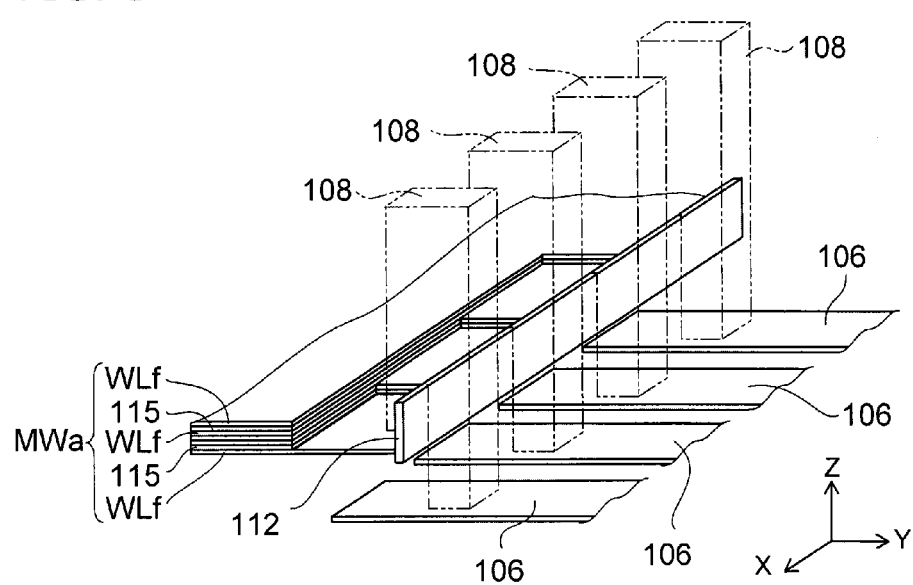
FIG. 5 is a perspective view exemplifying a connection state between the electrode film and a contact plug and a connection state between a lower layer interconnection and the contact plug.

FIG. 5 is a perspective view exemplifying a connection state between the electrode film and a contact plug and a connection state between a lower layer interconnection and the contact plug.

As shown in FIG. 3, a lower layer interconnection 106 is provided on the interlayer insulating film 102 in the word line lead-out area WLa. Although not shown, the lower layer interconnection 106 is connected to the upper surface of the silicon substrate 101. By this, the lower layer interconnection 106 is connected to the drive circuit provided in the upper layer part and on the upper surface of the silicon substrate. The lower layer interconnection 106 is processed in an arbitrary interconnection pattern. Incidentally, a part of the lower layer interconnection 106 may be arranged in the memory area M. Besides, the lower layer interconnection 106 may be arranged between the selection gate electrode SSG and the silicon substrate 101. Further, the lower layer interconnection 106 may be arranged between the electrode film WLf and the selection gate electrode SGS in the Z-direction.

An interlayer insulating film 107 is provided on the interlayer insulating film 102. The interlayer insulating film 107 covers the lower layer interconnection 106. The interlayer insulating film 107 contains, for example, an insulating material such as silicon oxide.

In the memory area M, inter-electrode insulating films 109 are embedded between the word lines WL, the bit lines BL and the memory films 105.

In the word line lead-out area WLa, a stacked body MWa including the plural plate-like electrode films WLf and plural inter-electrode insulating films 115 is provided on the interlayer insulating film 107. The plural electrode films WLf are separated from each other, and are stacked in the Z-direction. The inter-electrode insulating films 115 are respectively provided between the electrode films WLf. The word lines WL included in each of the word line interconnection layers 104 arranged in the memory area M extend along the Y-direction from the plate-like electrode films WLf. The electrode film WLf and the word line WL contain, for example, a conductive material such as tungsten (W) or titanium nitride (TiN). As stated above, among the word lines WL included in the same word line interconnection layer 104, the odd-numbered word lines WL counted in the X-direction extend from the same electrode film WLf arranged in the word line lead-out area WLa. The even-numbered word lines WL extend from the same electrode film WLf arranged in the word line lead-out area WLb. By this, as stated above, when viewed from the Z-direction, the shape of the electrode films WLf and the word lines WL becomes a comb shape.

As shown in FIG. 4 and FIG. 5, an end of the stacked body MWa in the Y-direction is formed in a step shape along the X-direction. At the end of the stacked body MWa and in a portion just above the electrode film WLf of a lower layer, the electrode film WLf and the inter-electrode insulating film 115 of layers upper than the lower layer are not arranged.

As shown in FIG. 3 and FIG. 4, the portion of the stacked body MWa formed in the step shape is covered with an insulating film 111. In the word line lead-out area WLa, a portion of the stacked body MWa not covered with the insulating film 111 is covered with an interlayer insulating film 110. The interlayer insulating film 110 is provided over the stacked body ML in the word line lead-out area WLa and the memory area M. In the Z-direction, the upper surface of the insulating film 111 and the upper surface of the interlayer insulating film 110 are positioned at almost the same height. The insulating film 111 contains, for example, an insulating material such as silicon oxide.

Besides, an insulating member 112 is provided on a side surface in the Y-direction of the insulating film 111 and a side surface in the Y-direction of each of the electrode films WLf not covered with the insulating film 111. The shape of the insulating member 112 is a band shape rising from the silicon substrate 101 and extending in the X-direction. In the Z-direction, the upper surface of the insulating member 112 is formed at a position higher than the upper surface of the stacked body ML and lower than the upper surface of the interlayer insulating film 110.

The side surface in the Y-direction of the insulating member 112 and at least a part of the upper surface thereof are covered with an insulating film 113. In the Z-direction, the upper surface of the insulating film 113 is formed at almost the same position as the upper surface of the interlayer insulating film 110 and the upper surface of the insulating film 111.

An insulating film 114 is provided on the interlayer insulating film 110 and the insulating films 111 and 113.

The insulating member 112 is formed of a material different from the interlayer insulating film 107, and the insulating films 113, 111 and 114.

As shown in FIG. 3, a contact hole 108d is formed to pass through the insulating films 114, 113 and 111 and the interlayer insulating film 107. When viewed from the X-direction, the contact hole 108d has a shape branched into two with respect to the insulating member 112. The lower end of the contact hole 108d reaches the upper surface of the end of the electrode film WLf and the upper surface of the lower layer interconnection 106. The contact hole 108d is formed for each step of the portion of the stacked body MWa formed in the step shape. The respective contact holes 108d do not contact the selection gate electrodes SSG.

A contact plug 108 is provided in the contact hole 108d. The contact plug 108 is provided with an upper part 108a and a lower portion. The lower portion of the contact plug 108 is formed into a shape branched into two from the upper part 108a. In the lower portion, a portion 108b as one portion of the branched portions is connected to the upper surface of the portion of the stacked body MWa formed in the step shape. Besides, a portion 108c as the other portion of the branched portions is connected to the lower layer interconnection 106. At this time, the insulating member 112 is arranged between the portion 108b and the portion 108c.

As shown in FIG. 4 and FIG. 5, in the word line lead-out area WLa, the contact plug 108 is connected to each of the electrode films WLf. Besides, a plurality of the lower layer interconnections 106 are provided, and the portions 108c of the respective contact plugs 108 are respectively connected to the separate lower layer interconnections 106.

Next, a method for manufacturing the memory device 100 of the embodiment will be described.

FIG. 6A to FIG. 18D are schematic views exemplifying the method for manufacturing the memory device of the embodiment.

FIG. 6A, FIG. 8A, FIG. 11A and FIG. 13A are perspective views exemplifying the shape of the stacked body in the word line lead-out area. FIG. 6B, FIG. 8B, FIG. 11B and FIG. 13B are top views exemplifying the shape of the stacked body in the word line lead-out area.

Figure 6A:
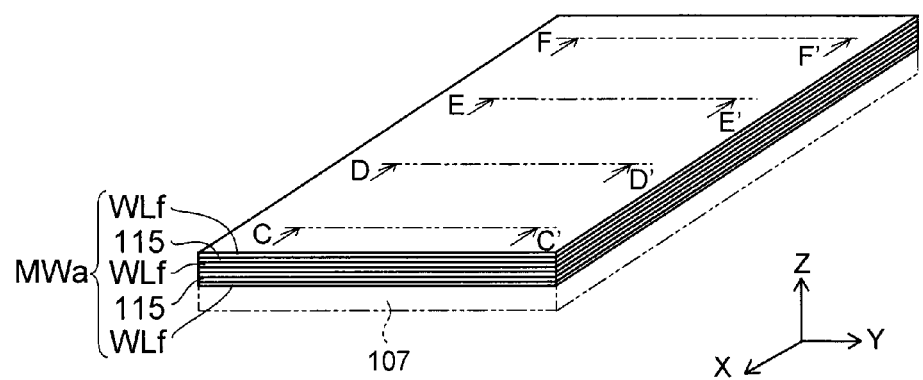
Figure 6B:
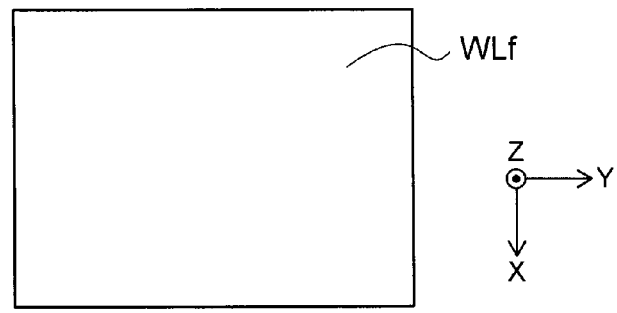
Figure 7A:
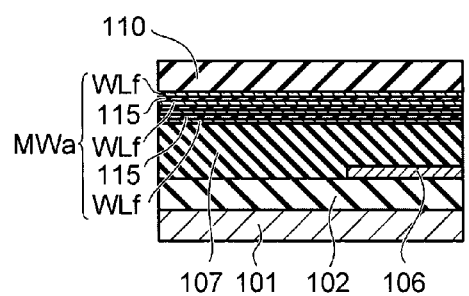
Figure 7B:
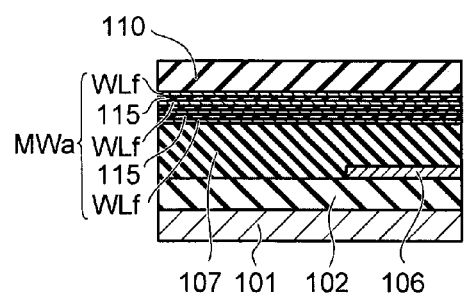
Figure 7C:
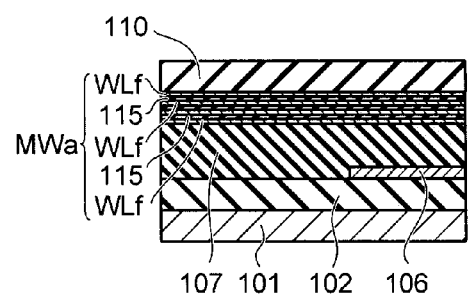
Figure 7D:
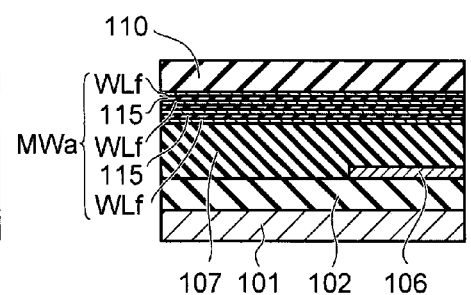

FIG. 7A is a sectional view along line C-C' shown in FIG. 6A. FIG. 7B is a sectional view along line D-D' shown in FIG. 6A. FIG. 7C is a sectional view along line E-E' shown in FIG. 6A. FIG. 7D is a sectional view along line F-F' shown in FIG. 6A.

Figure 8A:
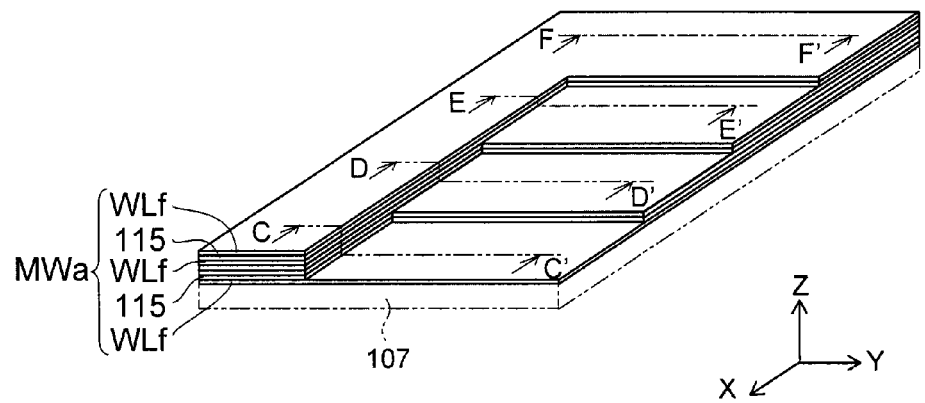
Figure 8B:
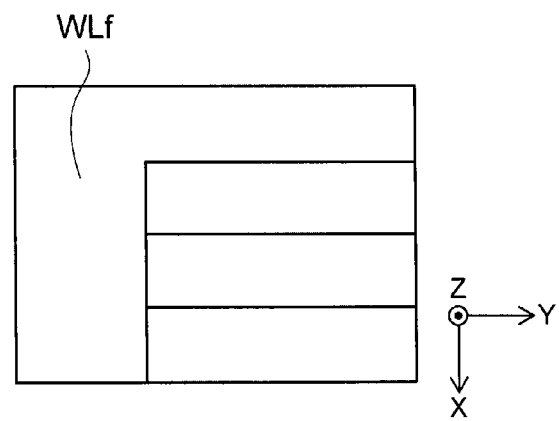
Figures 9A, 9B:
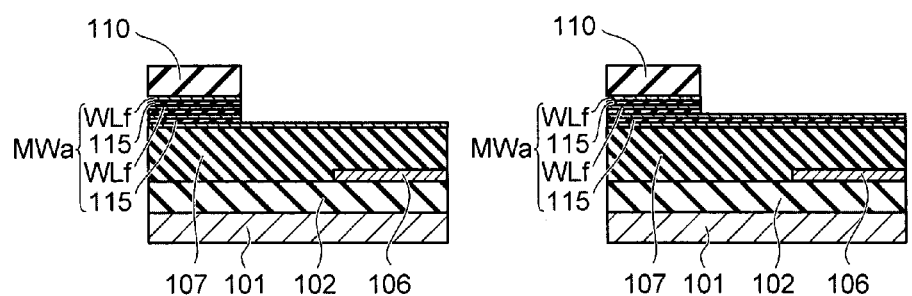
Figures 9C, 9D:
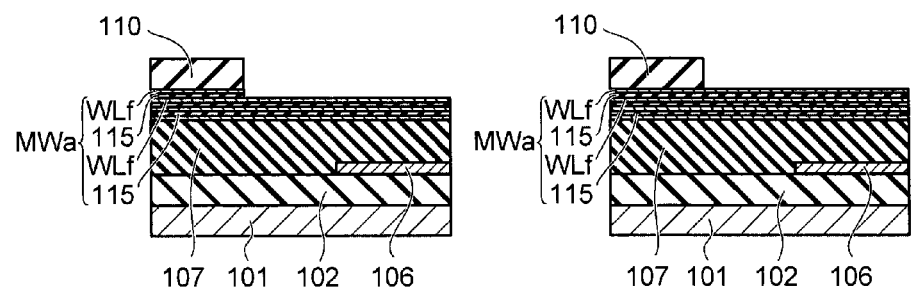

FIG. 9A is a sectional view along line C-C' shown in FIG. 8A. FIG. 9B is a sectional view along line D-D' shown in FIG. 8A. FIG. 9C is sectional views along line E-E' shown in FIG. 8A. FIG. 9D is a sectional view along line F-F' shown in FIG. 8A.

FIG. 10A is a sectional view corresponding to a section along line C-C' shown in FIG. 8A. FIG. 10B is a sectional view corresponding to a section along line D-D' shown in FIG. 8A. FIG. 10C is a sectional view corresponding to a section along line E-E' shown in FIG. 8A. FIG. 10D is a sectional view corresponding to a section along line F-F' shown in FIG. 8A.

Figure 11A:
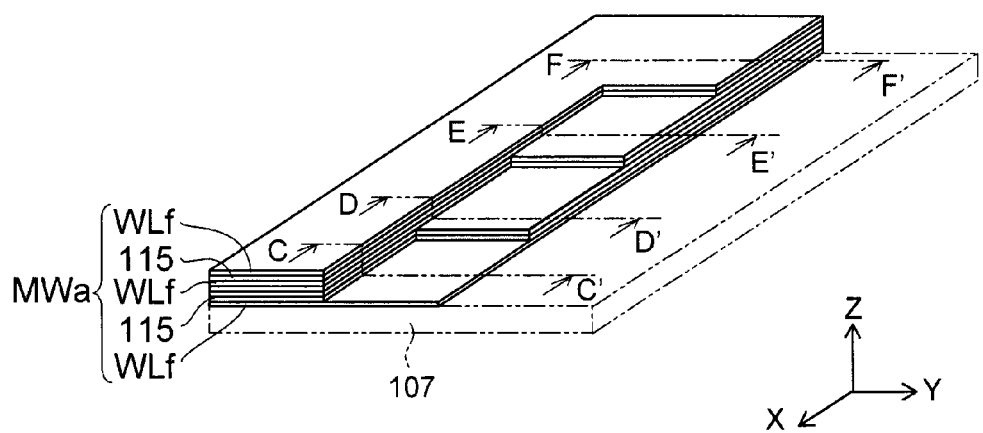
Figure 11B:
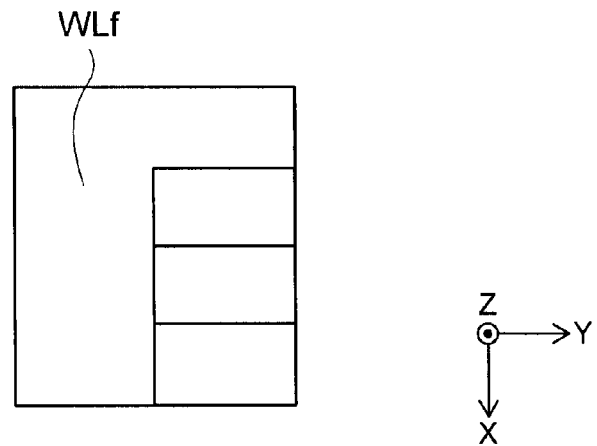
Figures 12A, 12B:
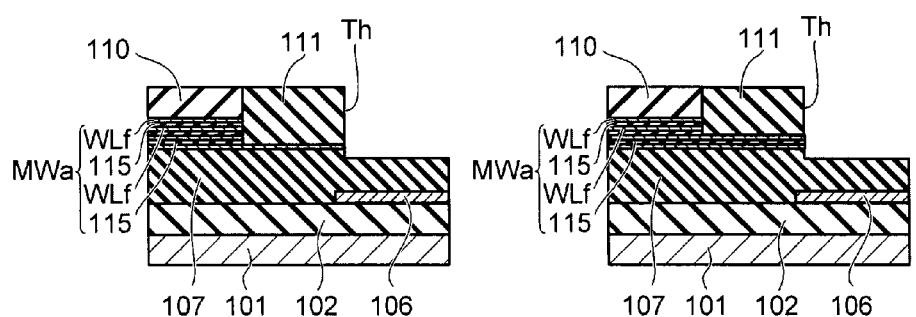
Figures 12C, 12D:
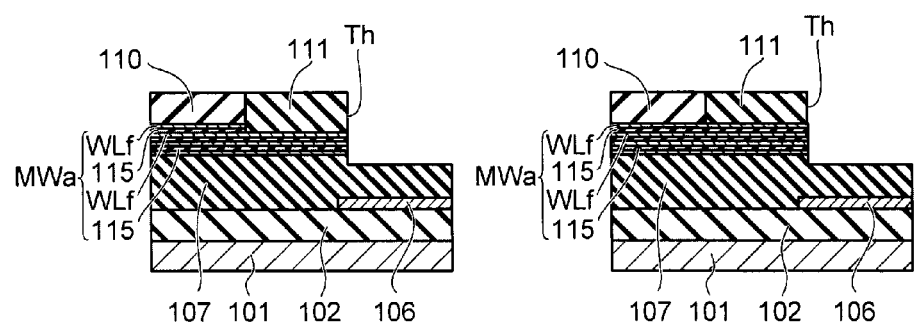

FIG. 12A is a sectional view along line C-C' shown in FIG. 11A. FIG. 12B is a sectional view along line D-D'
shown in FIG. 11A. FIG. 12C is a sectional view along line E-E' shown in FIG. 11A. FIG. 12D is a sectional view along line F-F' shown in FIG. 11A.

Figure 13A:
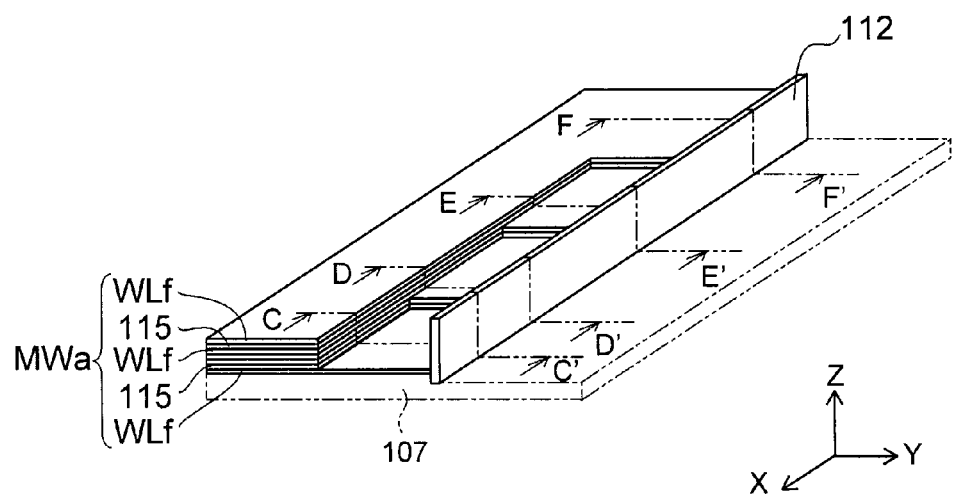
Figure 13B:
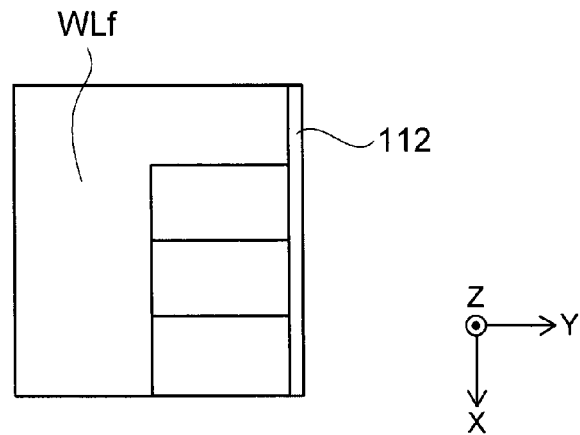
Figure 14A:
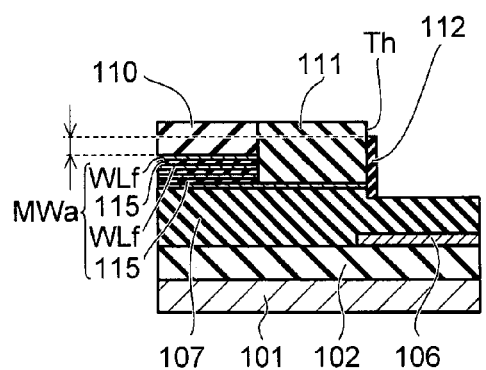
Figure 14B:
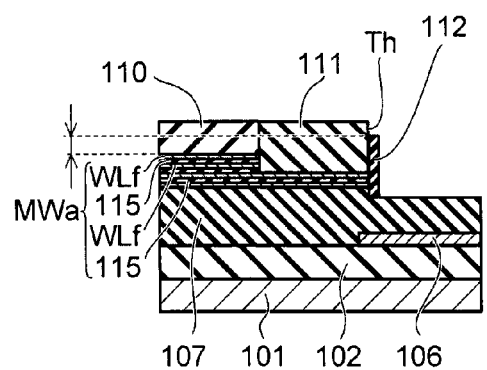
Figure 14C:
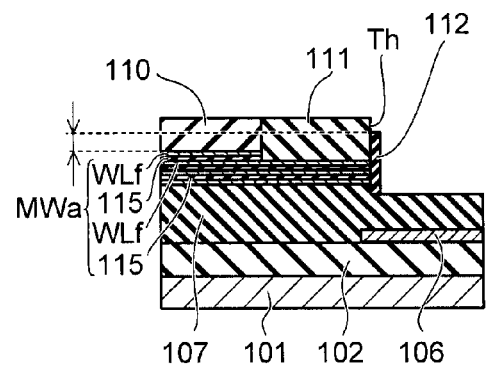
Figure 14D:
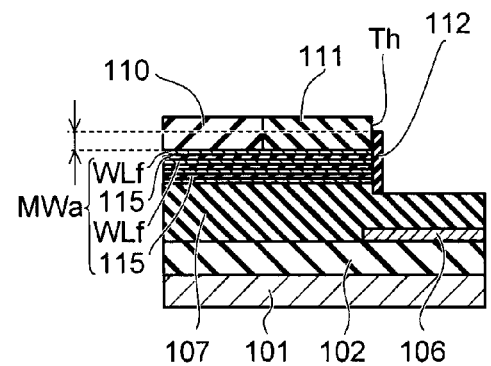
Figures 15A, 15B:
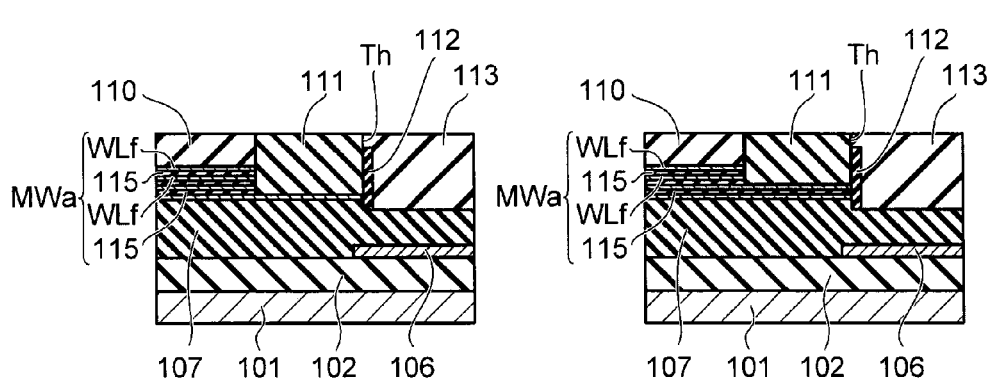
Figures 15C, 15D:
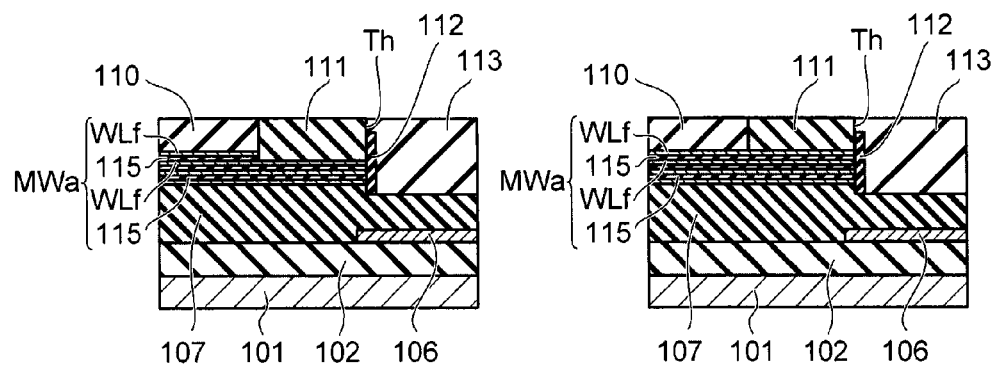
Figure 16A:
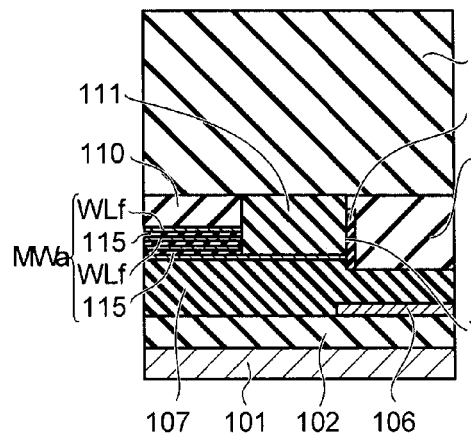
Figure 16B:
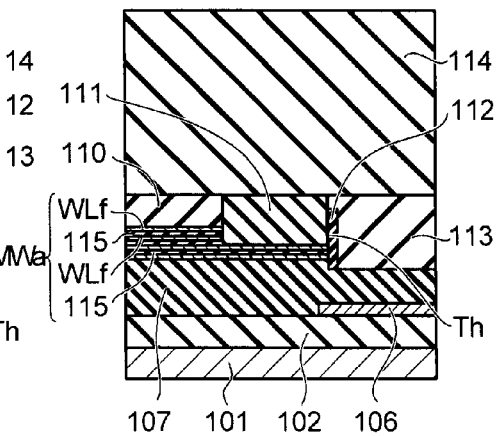
Figure 16C:
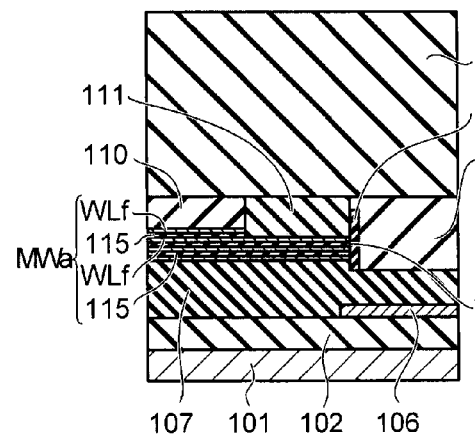
Figure 16D:
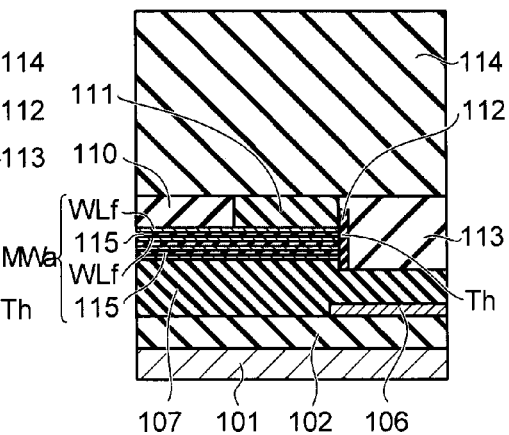
Figures 17A, 17B:
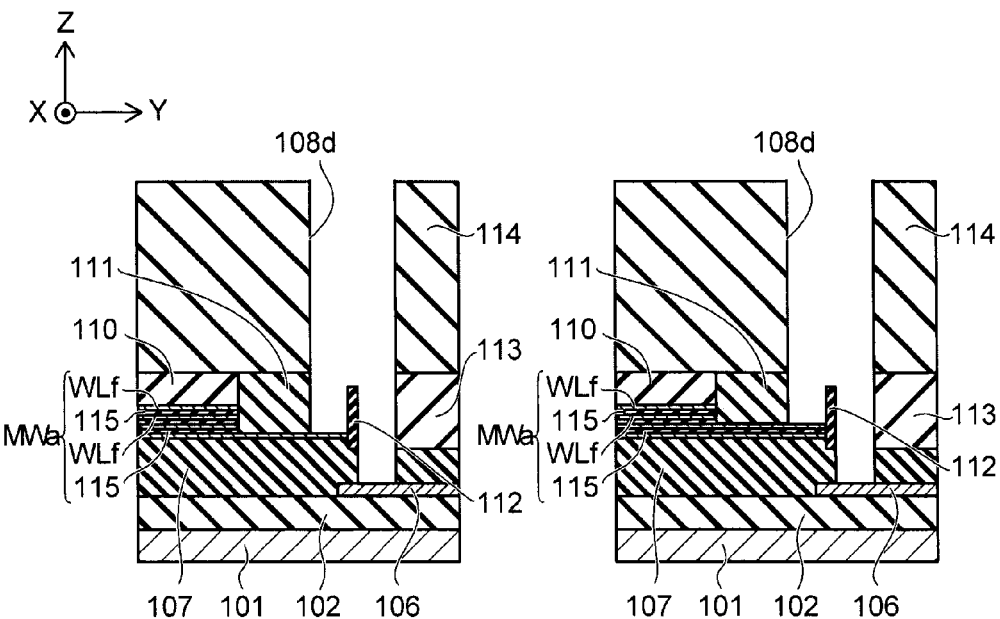
Figures 17C, 17D:
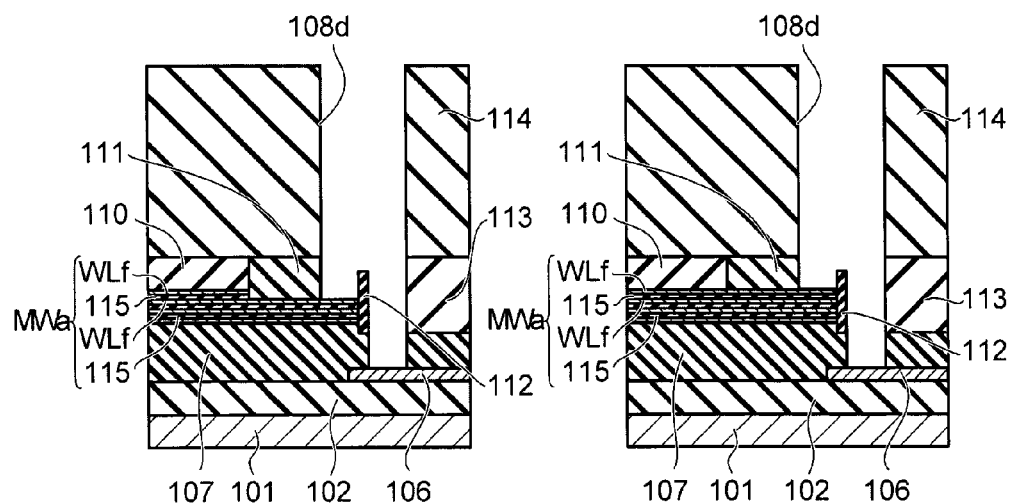
Figure 18A:
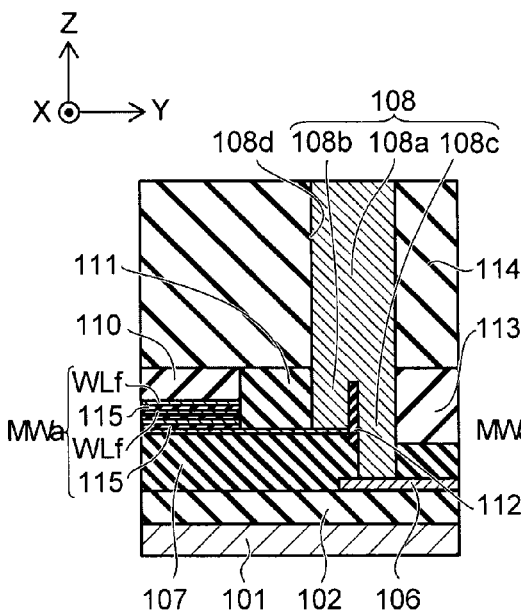
Figure 18B:
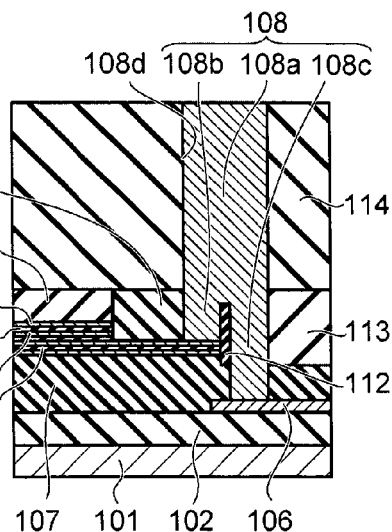
Figure 18C:
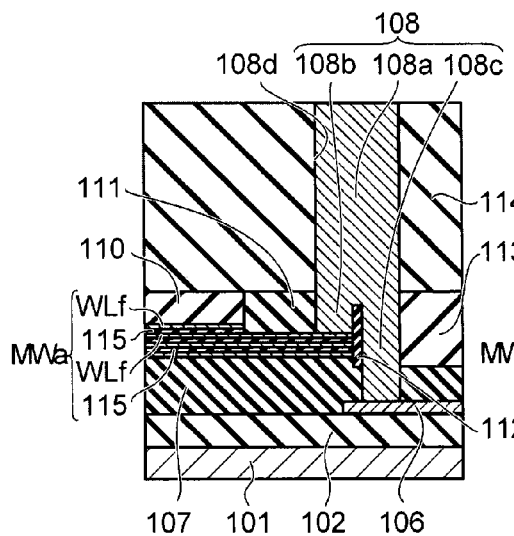
Figure 18D:
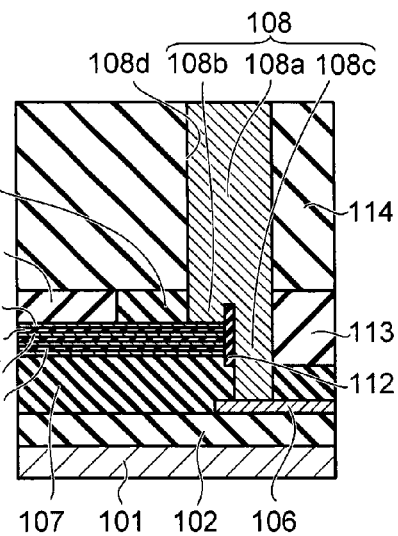

FIG. 14A is a sectional view along line C-C' shown in FIG. 13A. FIG. 14B is a sectional view along line D-D' shown in FIG. 13A. FIG. 14C is a sectional view along line E-E' shown in FIG. 13A. FIG. 14D is a sectional view along line F-F' shown in FIG. 13A.

FIG. 15A, FIG. 16A, FIG. 17A and FIG. 18A are sectional views corresponding to a section along line C-C' shown in FIG. 13A. FIG. 15B, FIG. 16B, FIG. 17B and FIG. 18B are sectional views corresponding to a section along line D-D' shown in FIG. 13A. FIG. 15C, FIG. 16C, FIG. 17C and FIG. 18C are sectional views corresponding to a section along line E-E' shown in FIG. 13A. FIG. 15D, FIG. 16D, FIG. 17D and FIG. 18D are sectional views corresponding to a section along line F-F' shown in FIG. 13A.

First, as shown in FIG. 6A to 7D, a drive circuit (not shown) is formed in the upper layer part and the upper surface of the silicon substrate 101. Then, the interlayer insulating film 102 covering the drive circuit is formed on the silicon substrate 101.

Next, in the word line lead-out area WLa, the lower layer interconnection 106 is formed on the interlayer insulating film 102 in an arbitrary interconnection pattern. Besides, although not shown, in the memory area M, the lower layer bit lines GBL are formed on the interlayer insulating film 102. Next, an interlayer insulating film 107a covering the lower layer interconnection 106 and the lower layer bit lines GBL is formed on the interlayer insulating film 102. Next, the selection gate electrodes SSG are formed on the interlayer insulating film 107a. Next, the selection gate electrodes SSG are covered with an interlayer insulating film 107b. By this, the interlayer insulating films 107a and 107b become the interlayer insulating film 107. Incidentally, a part of the lower layer interconnection 106 may be formed in the memory area M.

The interlayer insulating films 102 and 107 are formed using, for example, an insulating material such as silicon oxide.

Next, a conductive film is formed on the interlayer insulating film 107 and is patterned, so that the plural word lines WL are formed in the memory area M, and the electrode films WLf are formed in the word line lead-out area WLa. The word line WL led to the word line lead-out area WLa side and the electrode film WLf are integrally formed. Beside, although not shown, the electrode films WLf are formed also in the word line lead-out area WLb from the same conductive film. The word lines WL led to the word line lead-out area WLb side and the electrode films WLf are formed.

Next, the word lines WL and the electrode films WLf are embedded by the inter-electrode insulating film 109 (115), and a flattening treatment such as CMP is performed. The above process is repeated, so that the stacked body ML is formed in the memory area M, the stacked body MWa is formed in the word line lead-out area WLa, and the stacked body MWb is formed in the word line lead-out area WLb. Thereafter, the interlayer insulating film 110 is formed by an insulating material such as silicon oxide on the stacked body MWa and the stacked body ML. As shown in FIG. 8A to FIG. 9D, at the end side in the Y-direction of the stacked body MWa, part of the interlayer insulating film 110 and the stacked body MWa are removed by performing lithography and dry etching, and a stepped shape is formed. At this time, for example, lithography and dry etching are performed plural times, and the upper surfaces of the respective electrode films WLf are exposed, so that step parts are formed, and the end side of the stacked body MWa is made stepwise. In the case of the embodiment, the end of the stacked body MWa in the Y-direction side is formed into the stepped shape rising along the X-direction.

Next, as shown in FIG. 10A to FIG. 10D, an insulating material such as silicon oxide is deposited on the whole surface. Thereafter, a flattening treatment such as CMP (Chemical Mechanical Polishing) is performed, so that the insulating material deposited on the interlayer insulating film 110 is removed, and the insulation material is made to remain on the stepwise processed portion of the electrode film WLf. By this, the insulating film 111 covering the stepwise processed portion of the electrode film WLf is formed.

Next, in the memory area M, a memory hole passing through the interlayer insulating film 110 and the inter-electrode insulating film 109 is formed between the word lines WL and just above the lower layer bit line GBL. The gate insulating film GI is formed at a lower part on the inner surface of the memory hole, and the memory film 105 is formed at an upper part on the inner surface. Thereafter, the selection element SS is formed at the lower part in the memory hole, and the bit line BL is formed on the selection element SS.

Next, as shown in FIG. 11A to FIG. 12D, the insulating film 111 and a portion arranged just below the insulating film 111 in the stacked body MWa are partially removed by lithography and dry etching, and the insulating film 111 is removed in the Y-direction from the center part to the end. Thereafter, the lower layer stacked body MWa exposed by removing the insulating film 111 is removed. By this, a trench Th is formed, and the upper surface of the interlayer insulating film 107 is partially exposed.

Next, an insulating film including an insulating material such as silicon nitride is formed on the whole surface. The insulating film containing silicon nitride is formed to be sufficiently thinner than the film thickness of the interlayer insulating film 110 and the insulating film 111. Thereafter, dry etching is performed on this insulating film. By this, the insulating film containing silicon nitride other than a portion covering the side surface of the trench Th is removed, and as shown in FIG. 13A to FIG. 14D, the insulating member 112 is formed on the side surface of the trench Th. The shape of the insulating member 112 is a band shape rising from the silicon substrate 101 and extending in the X-direction. The insulating member 112 is formed of a material different from the insulating film 111 and the interlayer insulating film 107. The height of the upper surface of the insulating member 112 is not lower than the height of the upper surface of the stacked body MWa and lower than the upper surface of the insulating film 111. The film thickness of the insulating film containing silicon nitride is formed to be sufficiently thinner than the film thickness of the interlayer insulating films 110 and 111, so that the upper surface of the insulating member 112 can be formed at the height not lower than the upper surface of the stacked body MWa after dry etching.

Next, as shown in FIG. 15A to FIG. 15D, after an insulating material such as silicon oxide is deposited on the whole surface, a flattening treatment such as CMP is performed. By this, the insulating material is made to remain in the trench Th, and the insulating film 113 is formed. At this time, the insulating member 112 is covered with the insulating film 113. Besides, in the Z-direction, the upper surface of the insulating film 113 is located at almost the same position as the upper surface of the insulating film 111.

Next, as shown in FIG. 16A to FIG. 16D, an insulating material such as silicon oxide is deposited on the interlayer insulating film 110 and the insulating films 111 and 113, so that the insulating film 114 is formed.

Next, as shown in FIG. 17A to FIG. 17D, dry etching is performed under such condition that the etching rate of silicon oxide is higher than the etching rate of silicon nitride and metal material. Part of the insulating films 114, 113 and 111 are removed by this dry etching, so that the contact hole 108d is opened. On the other hand, the insulating member 112 made of silicon nitride is not much etched. By this, when viewed from the X-direction, the contact hole 108d is formed into a shape branched into two with respect to the insulating member 112. The contact hole 108d reaches the upper surface of the end of the electrode film WLf and the upper surface of the lower layer interconnection 106. At this time, the contact hole 108d does not contact the selection gate electrode SSG. The contact hole 108d is formed for each step of the stepwise formed portion of the stacked body MWa. At this time, the insulating member 112, the lower layer interconnection 106 and the electrode film WLf function as an etching stopper. Incidentally, the insulating member 112 and the lower layer interconnection 106 have only to have a selection ratio to silicon oxide in the dry etching process, and may be formed of an insulating material other than silicon nitride.

Next, as shown in FIG. 18A to FIG. 18D, a conductive material is embedded in each of the contact holes 108d, and the contact plug 108 is formed. The contact plug 108 includes the upper part 108a and a lower portion. The lower portion of the contact plug 108 is formed into the shape branched into two with respect to the insulating member 112 from the upper part 108a. In the lower portion, the portion 108b as one of the two branched portions is connected to the upper surface of the electrode film WLf. Besides, the portion 108c as the other portion of the two branched portions is connected to the lower layer interconnection 106.

Although the method for manufacturing the word line lead-out area WLa is described, the same applies to the bit line lead-out area BLa.

By the above process, the memory device 100 of the embodiment is manufactured.

Next, effects of the embodiment will be described.

In the memory device 100 of the embodiment, the electrode film WLf and the lower layer interconnection 106 are connected by the one contact plug 108. By this, the area occupied by the contact plug becomes small, and miniaturization of the memory device becomes possible.

Incidentally, a method is conceivable in which the electrode film WLf and the lower layer interconnection 106 are connected by connecting the contact plug connected to the electrode film WLf and another contact plug connected to the lower layer interconnection 106. However, in this case, since an upper layer interconnection to connect the two contact plugs is required, a process of forming the upper layer interconnection is required, and the manufacturing cost increases. Besides, the contact holes are separately formed on the electrode film WLf and on the lower layer interconnection 106. In addition, the distance between the contact holes is difficult to be decreased, and the size of the memory device becomes large. Besides, since a minute contact hole is required to be formed according to the size of the memory device, the lithography process becomes difficult, and the manufacturing cost in the lithography process increases.

On the other hand, according to the embodiment, since the electrode film WLf and the lower layer interconnection 106 can be connected by the one contact plug 108, an upper layer interconnection becomes unnecessary. Accordingly, since the process of forming the upper layer interconnection can be omitted, reduction in manufacturing cost becomes possible. Besides, since the contact diameter of the contact hole 108d can be made large, the lithography process becomes easy, and reduction in manufacturing cost in the lithography process becomes possible First Modified Example of the First Embodiment Next, a first modified example of the first embodiment will be described.

Figure 19:
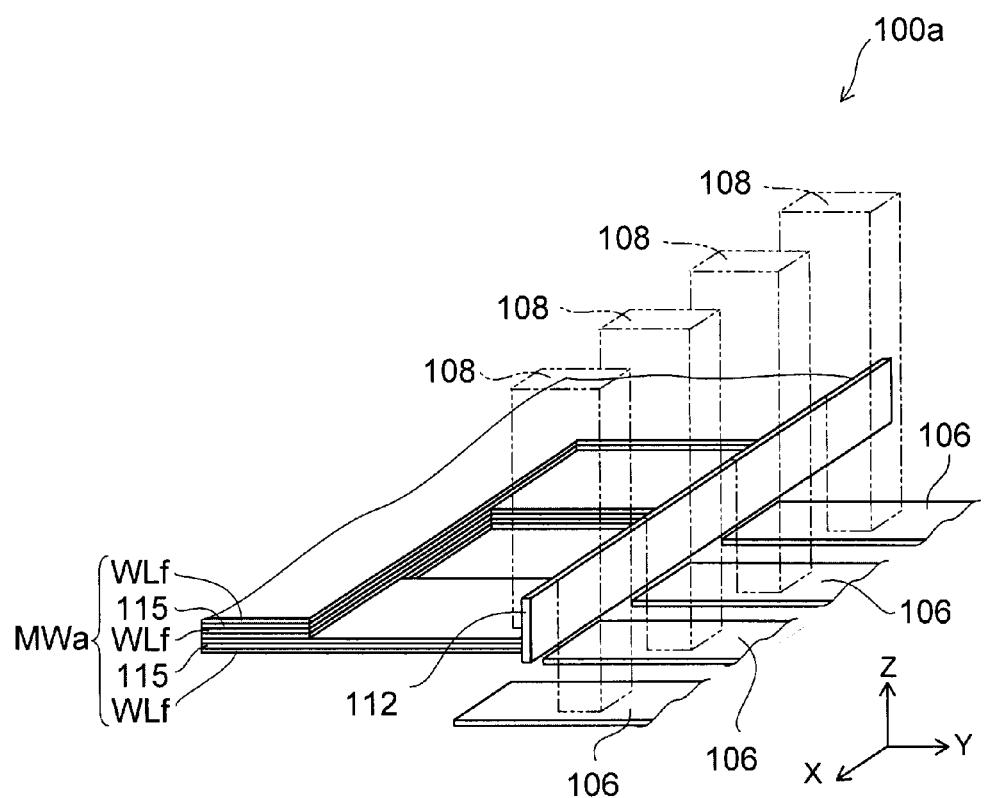
FIG. 19 is a perspective view exemplifying a connection state between an electrode film and a contact plug and a connection state between a lower layer interconnection and the contact plug in a memory device of a first modified example of the first embodiment.

FIG. 19 is a perspective view exemplifying a connection state between an electrode film and a contact plug and a connection state between a lower layer interconnection and the contact plug in a memory device of this modified example.

As shown in FIG. 19, in a memory device 100a of the modified example, an upper surface of a stacked body MWa at an end side in the Y-direction has a random step shape. That is, unlike the memory device 100 of the first embodiment, the shape is not such that the upper surface of the stacked body MWa becomes low stepwise along the X-direction.

The configuration other than the above-described shape of the stacked body MWa is the same as that of the first embodiment.

Next, a method for manufacturing the memory device 100a of the modified example will be described.

Figure 20A:
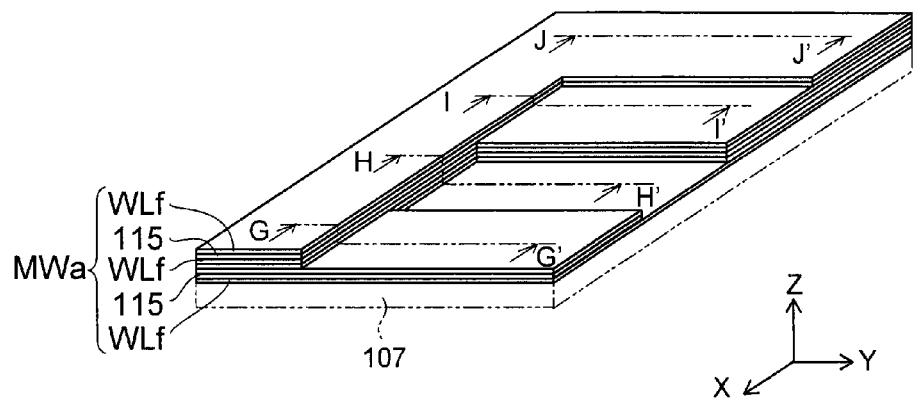
FIG. 20A to FIG. 21D are schematic views exemplifying the method for manufacturing the memory device of the first modified example of the first embodiment.
Figure 20B:
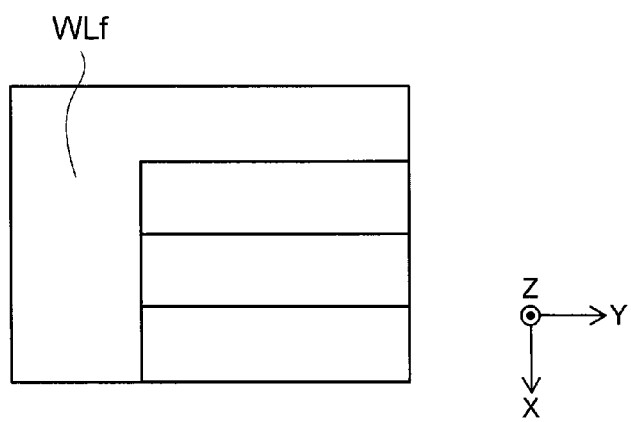
Figure 21A:
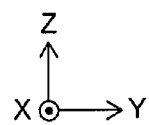
Figure 21A:
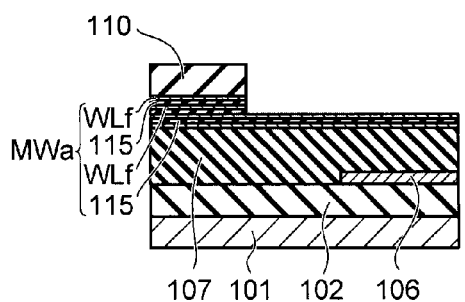
Figure 21B:
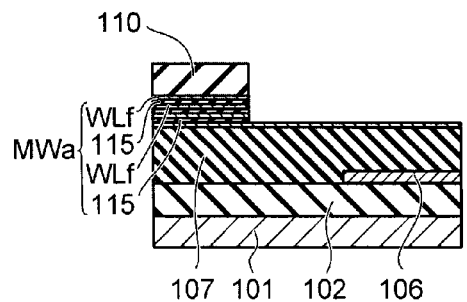
Figure 21C:
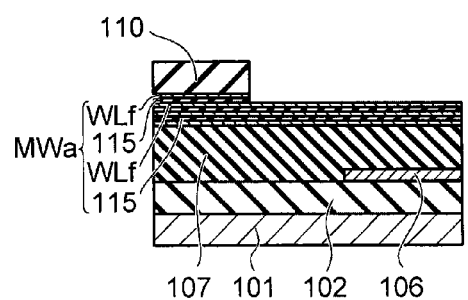
Figure 21D:
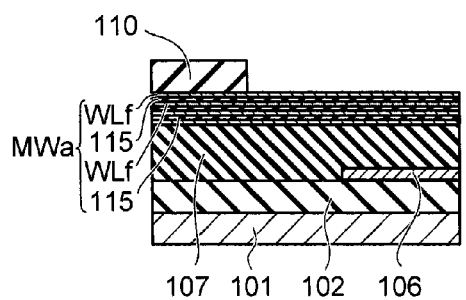

FIG. 20A to FIG. 21D are schematic views exemplifying the method for manufacturing the memory device of the modified example. FIG. 20A is a perspective view exemplifying the shape of a word line lead-out area of the stacked body, and FIG. 20B is a top view exemplifying the shape of the word line lead-out area of the stacked body. FIG. 21A is a sectional view along line G-G' shown in FIG. 20A. FIG. 21B is a sectional view along line H-H' shown in FIG. 20A. FIG. 21C is a sectional view along line I-I' shown in FIG. 20A. FIG. 21D is a sectional view along line J-J' shown in FIG. 20A.

First, the process shown in FIG. 6A to FIG. 7D is performed similarly to the first embodiment.

Next, as shown in FIG. 20A to FIG. 21D, step parts are formed at the end side in the Y-direction of the electrode film WLf of the stacked body ML by lithography and dry etching. The step parts are formed by exposing the upper surfaces of respective electrode films WLf of the stacked body ML.

Thereafter, a similar process to that of the first embodiment is performed, so that the memory device 100a of the modified example is manufactured.

The effects of the modified example are the same as those of the first embodiment.

Second Modified Example of the First Embodiment

Next, a second modified example of the first embodiment will be described.

Figure 22:
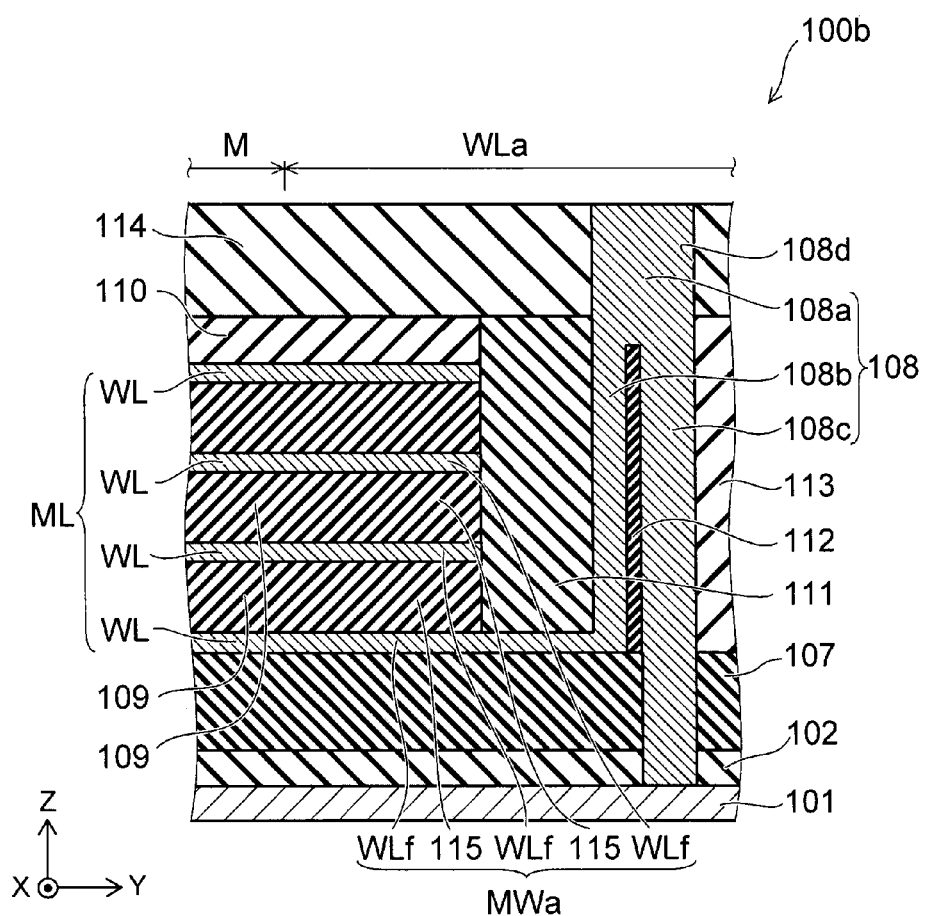
FIG. 22 is a sectional view showing a memory device of the second modified example of the first embodiment and corresponds to the section along line A-A' shown in FIG. 1.

FIG. 22 is a sectional view showing a memory device of this modified example and corresponds to the section along line A-A' shown in FIG. 1.

Figure 23:
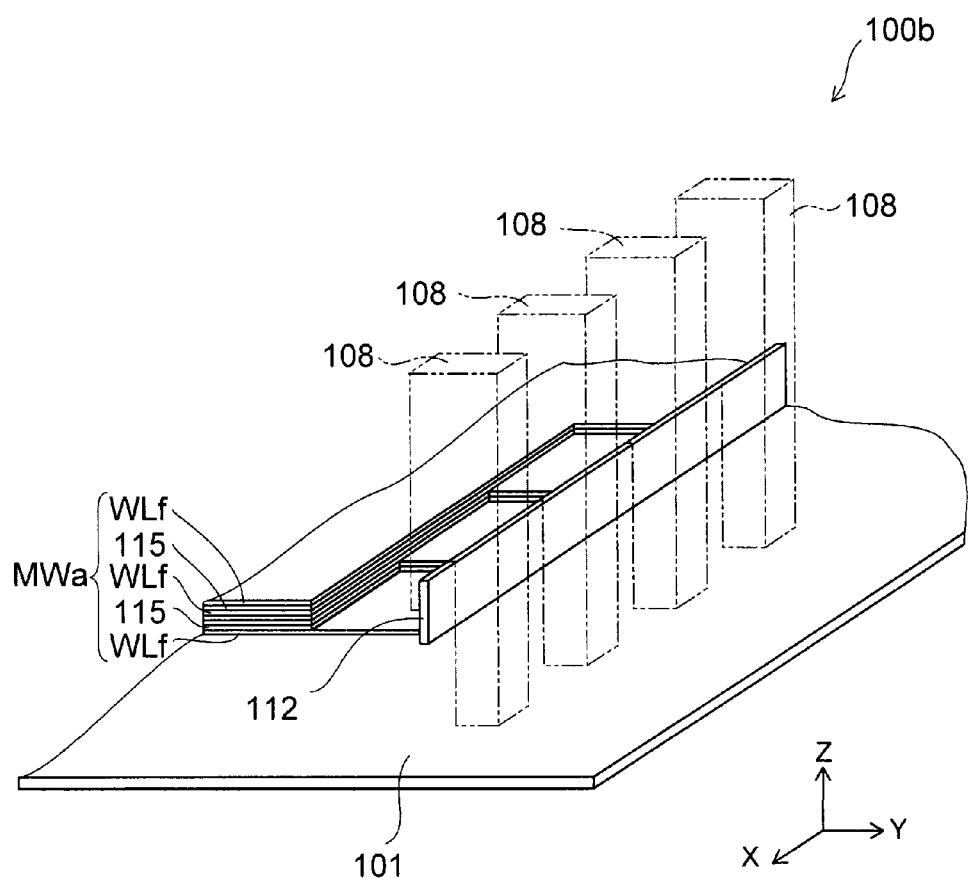
FIG. 23 is a perspective view exemplifying a connection state between an electrode film and a contact plug and a connection state between a silicon substrate and the contact plug of the memory device of a second modified example of the first embodiment.

FIG. 23 is a perspective view exemplifying a connection state between an electrode film and a contact plug and a connection state between a silicon substrate and the contact plug of the memory device of the modified example.

As shown in FIG. 22 and FIG. 23, in a memory device 100b of the modified example, a lower layer interconnection 106 connected between a contact plug 108 and a drive circuit formed on an upper surface of a silicon substrate 101 is not provided. Besides, a portion 108c of the contact plug 108 is connected to the upper surface of the silicon substrate 101 without intervening the lower layer interconnection 106.

The configuration and effects of the modified example other than the above are the same as those of the first embodiment.

Second Embodiment

Next, a second embodiment will be described.

Figure 24:
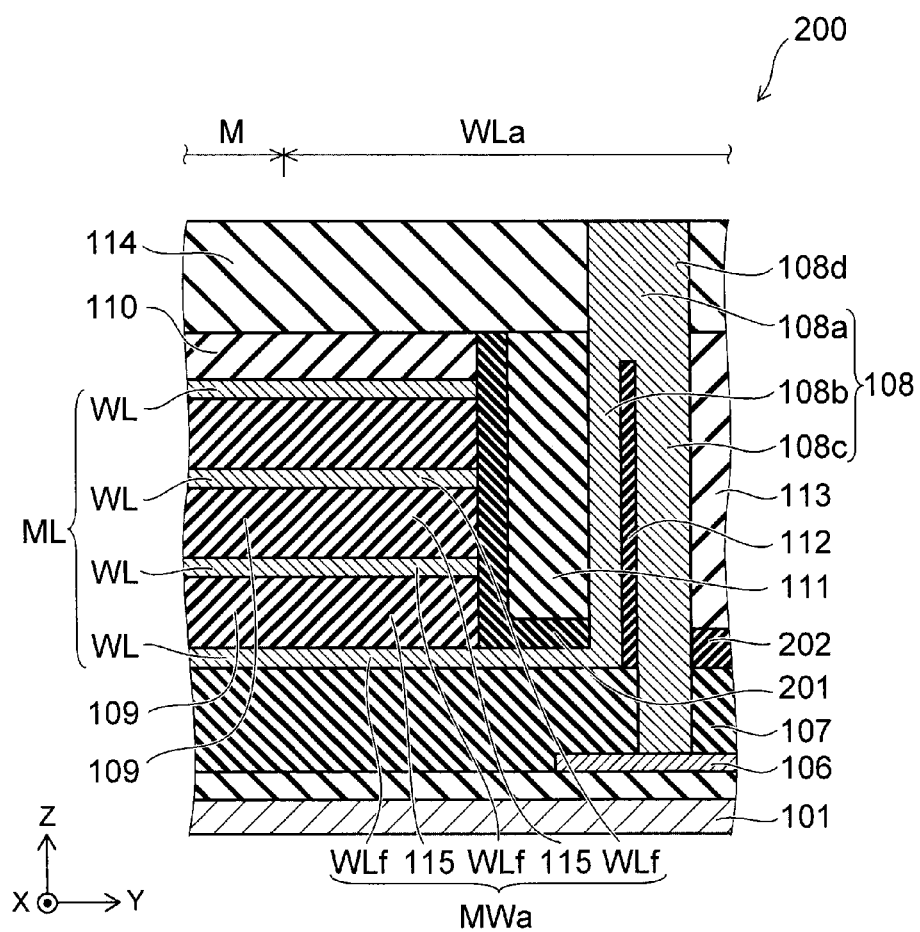
FIG. 24 is a sectional view showing a memory device of a second embodiment and corresponds to the section along line A-A' shown in FIG. 1.

FIG. 24 is a sectional view showing a memory device of the second embodiment and corresponds to the section along line A-A' shown in FIG. 1.

As shown in FIG. 24, in a memory device 200 of this embodiment, an insulating film 201 is provided on a side surface of an insulating film 111 at a memory area M side and a bottom surface thereof. Besides, an insulating film 202 is provided between an interlayer insulating film 107 and an insulating film 113.

The configuration other than the above is the same as that of the memory device 100 of the first embodiment.

Next, a method for manufacturing the memory device 200 of the embodiment will be described.

FIG. 25A to FIG. 33D are process sectional views exemplifying the method for manufacturing the memory device of the embodiment.

Figure 25A:
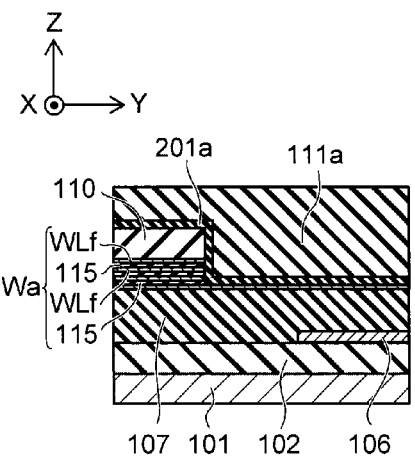
FIG. 25A to FIG. 33D are process sectional views exemplifying the method for manufacturing the memory device of the second embodiment.
Figure 25B:
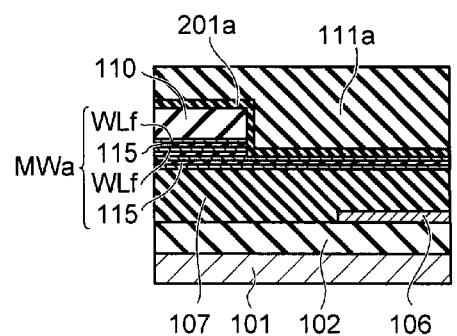
Figure 25C:
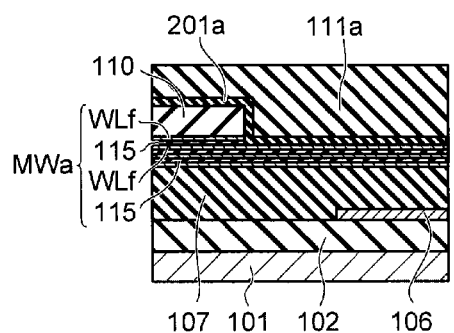
Figure 25D:
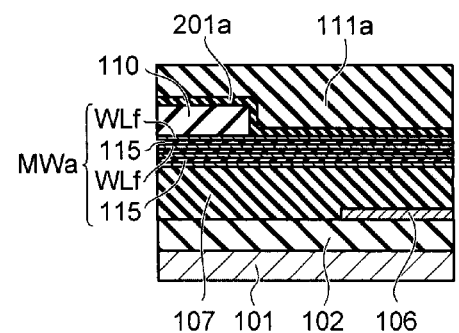
Figures 26A, 26B:
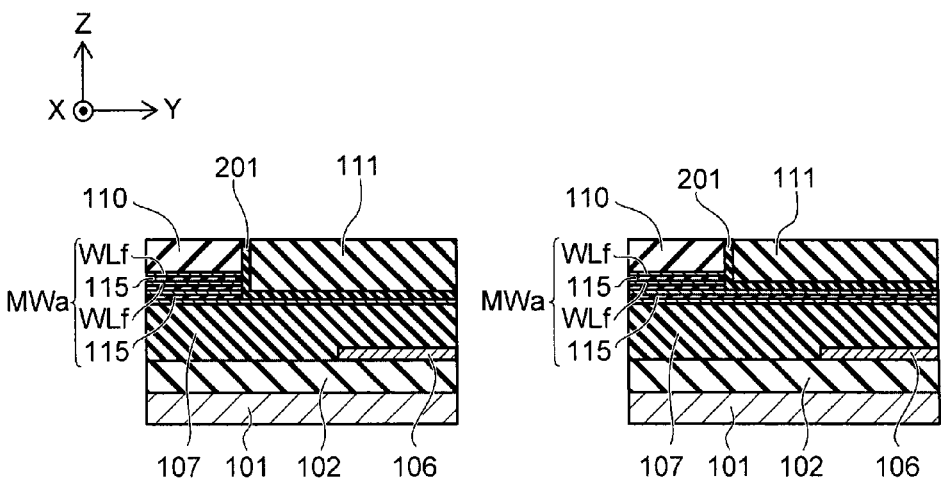
Figures 26C, 26D:
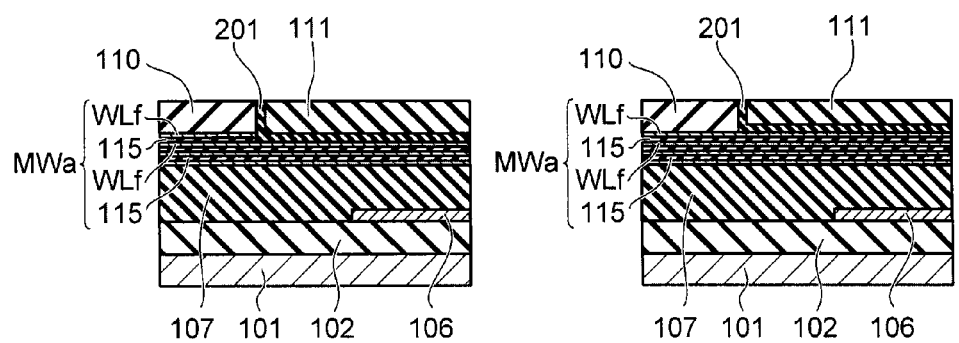
Figure 27A:
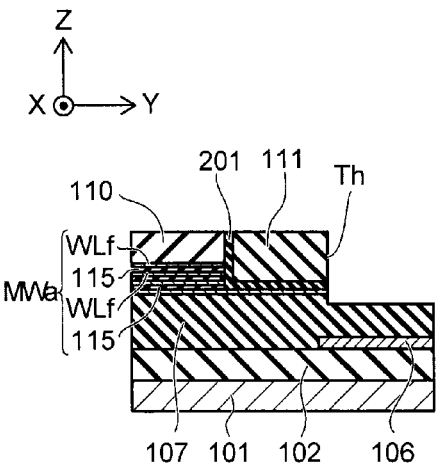
Figure 27B:
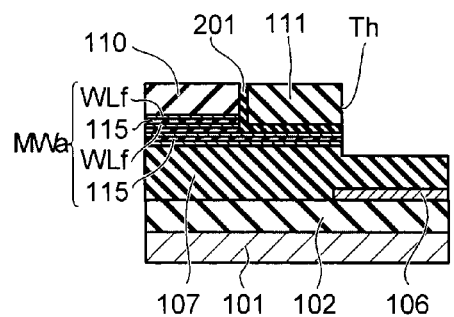
Figure 27C:
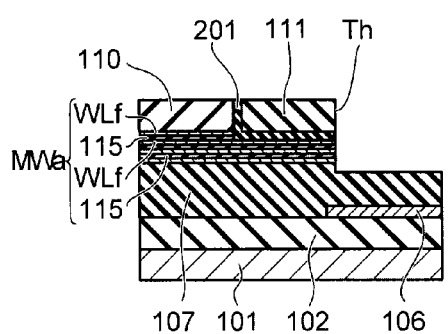
Figure 27D:
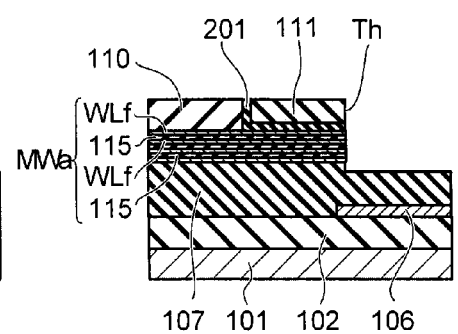
Figures 28A, 28B:
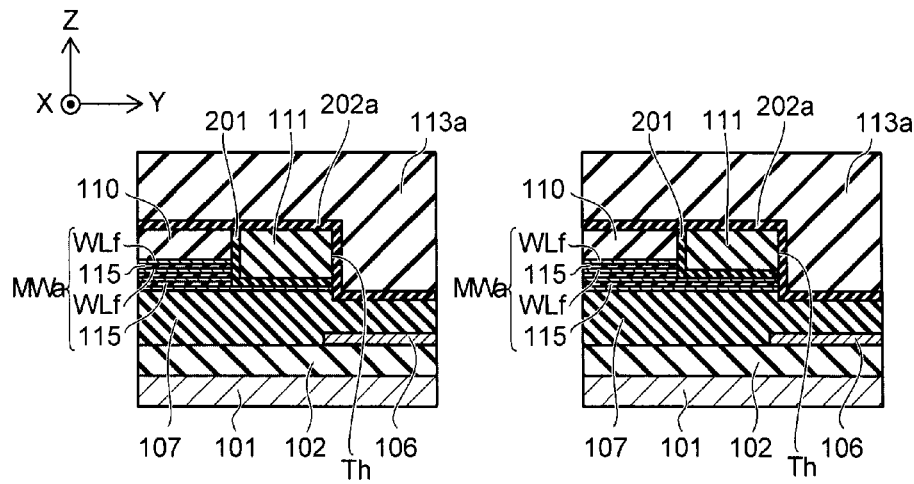
Figures 28C, 28D:
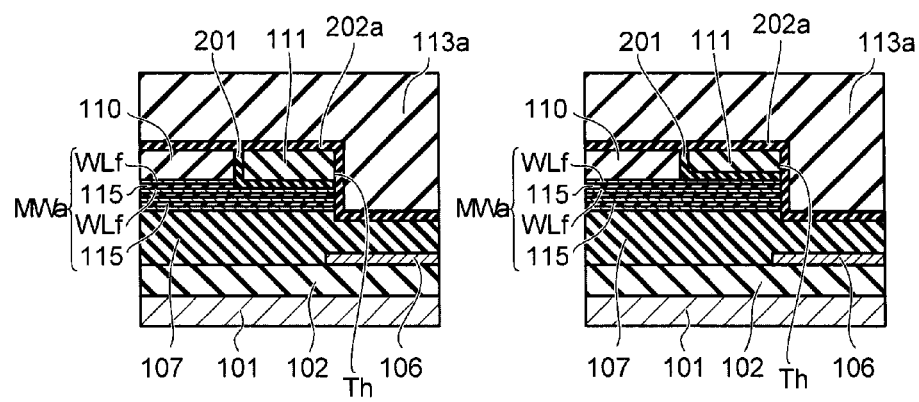
Figure 29A:
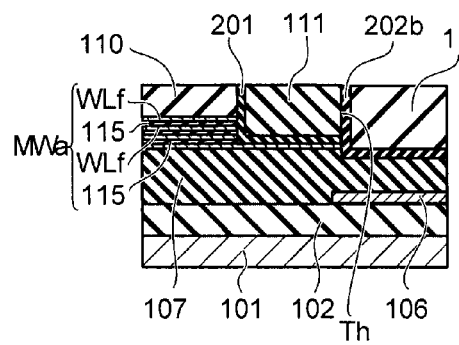
Figure 29B:
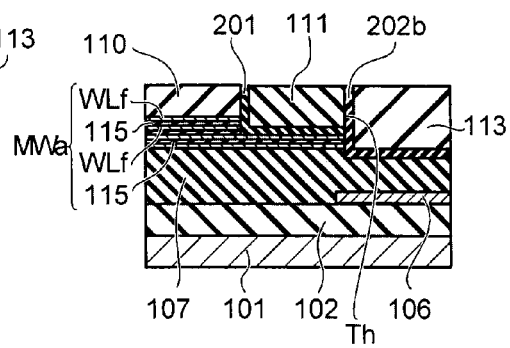
Figure 29C:
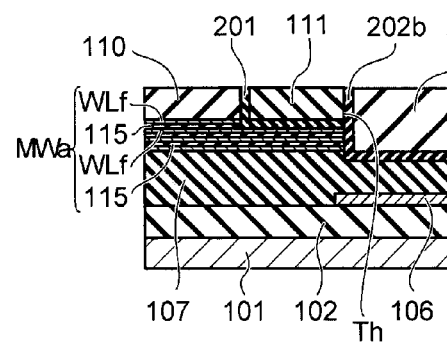
Figure 29D:
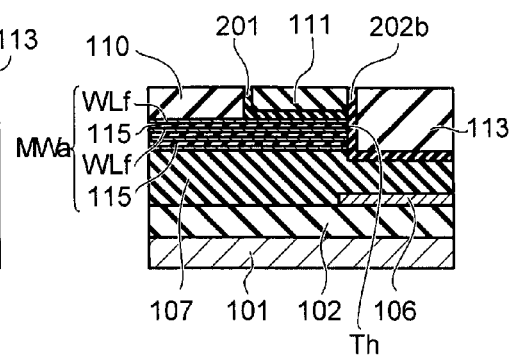
Figure 30A:
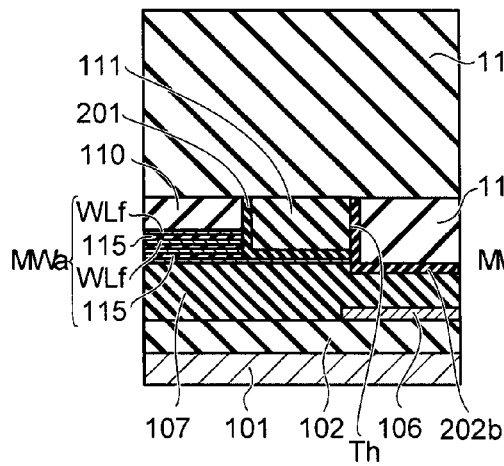
Figure 30B:
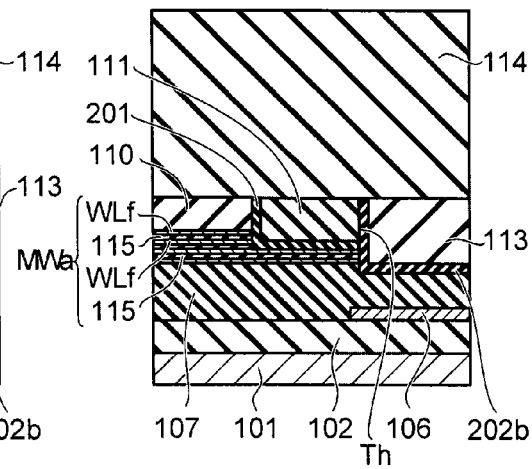
Figure 30C:
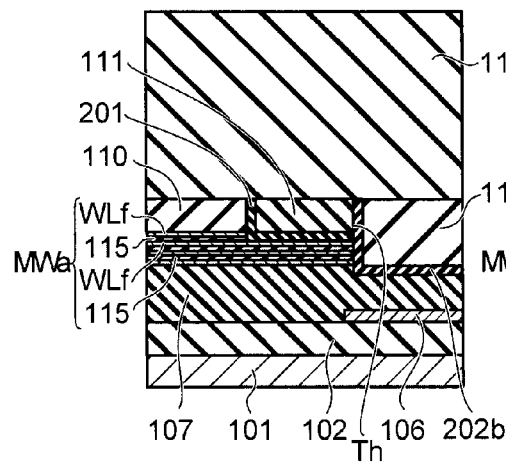
Figure 30D:
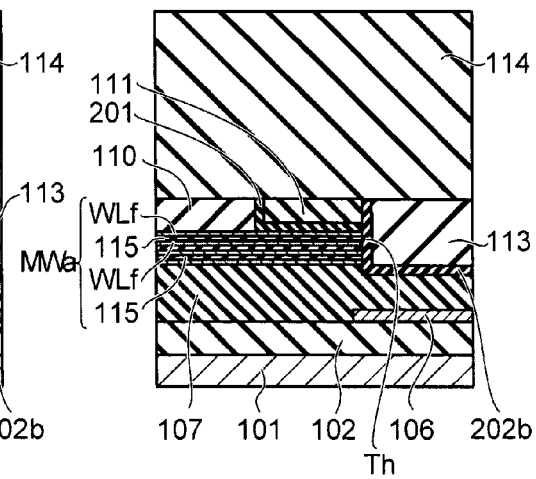
Figure 31A:
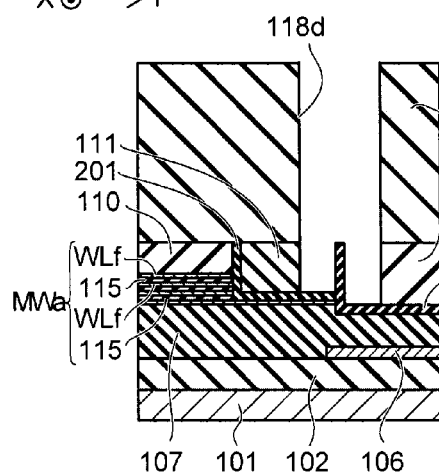
Figure 31B:
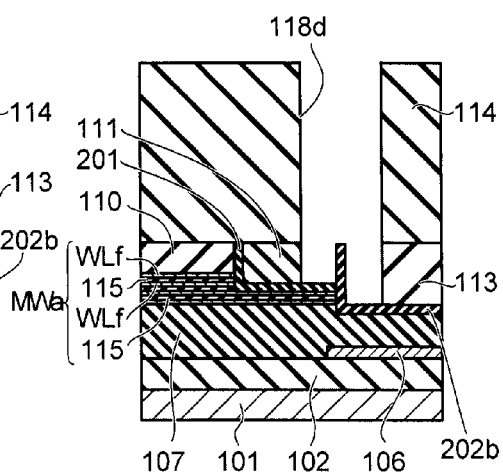
Figure 31C:
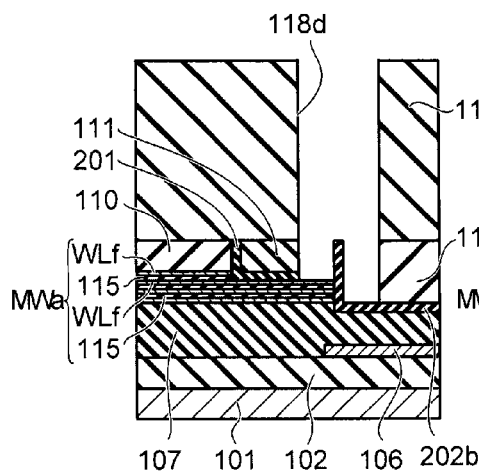
Figure 31D:
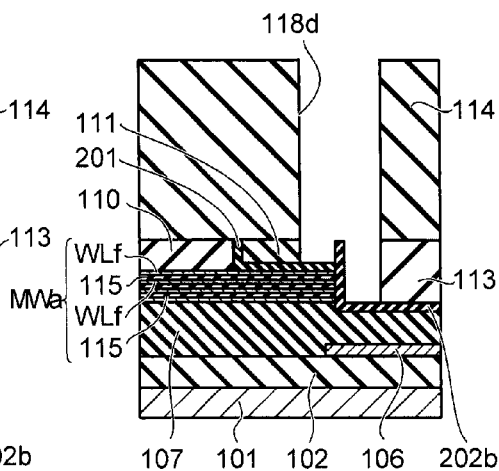

FIG. 25A and FIG. 26A are sectional views corresponding to the section along line C-C' shown in FIG. 8A. FIG. 25B and FIG. 26B are sectional views corresponding to the section along line D-D' shown in FIG. 8A. FIG. 25C and FIG. 26C are sectional views corresponding to the section along line E-E' shown in FIG. 8A. FIG. 25D and FIG. 26D are sectional views corresponding to the section along line F-F' shown in FIG. 8A.

FIG. 27A, FIG. 28A, FIG. 29A, FIG. 30A and FIG. 31A are sectional views corresponding to the section along line C-C' shown in FIG. 11A. FIG. 27B, FIG. 28B, FIG. 29B, FIG. 30B and FIG. 31B are sectional views corresponding to the section along line D-D' shown in FIG. 11A. FIG. 27C, FIG. 28C, FIG. 29C, FIG. 30C and FIG. 31C are sectional views corresponding to the section along line E-E' shown in FIG. 11A. FIG. 27D, FIG. 28D, FIG. 29D, FIG. 30D and FIG. 31D are sectional views corresponding to the section along line F-F' shown in FIG. 11A.

Figures 32A, 32B:
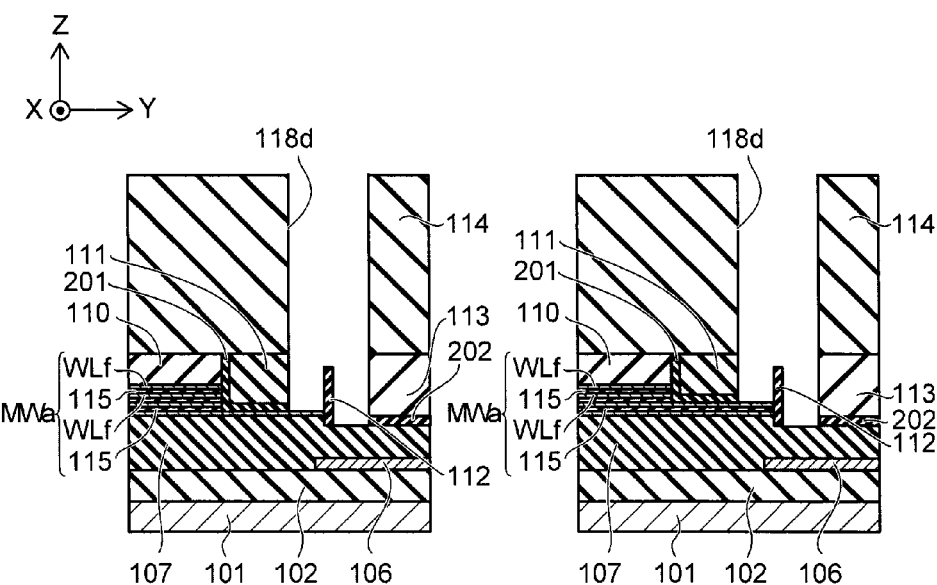
Figures 32C, 32D:
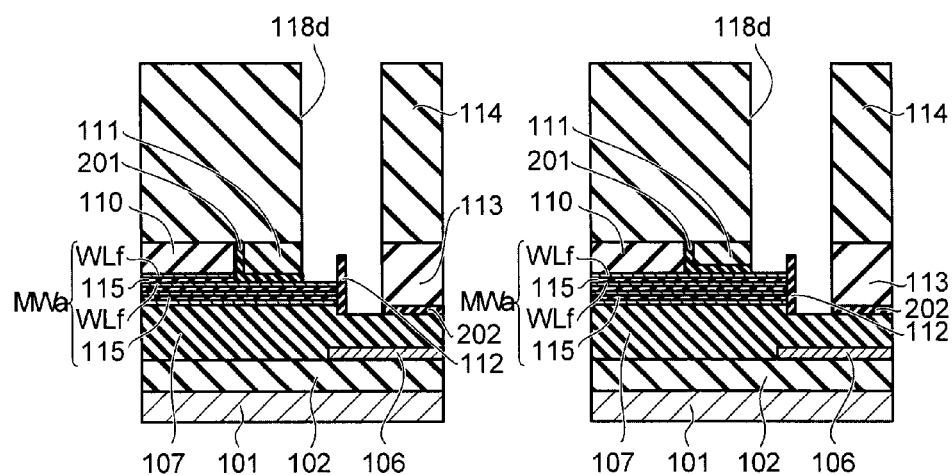
Figure 33A:
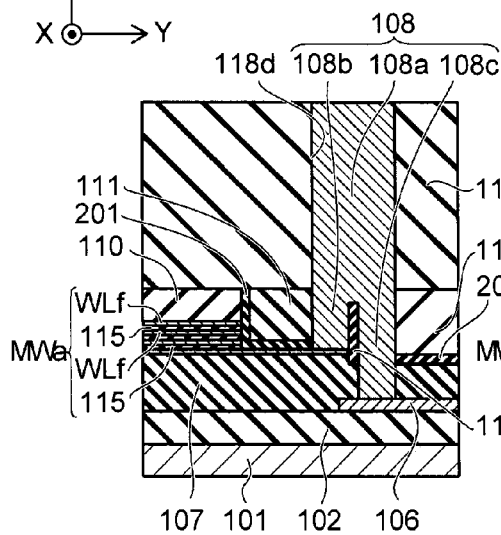
Figure 33B:
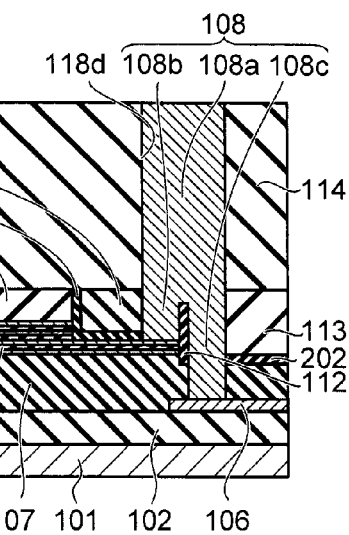
Figure 33C:
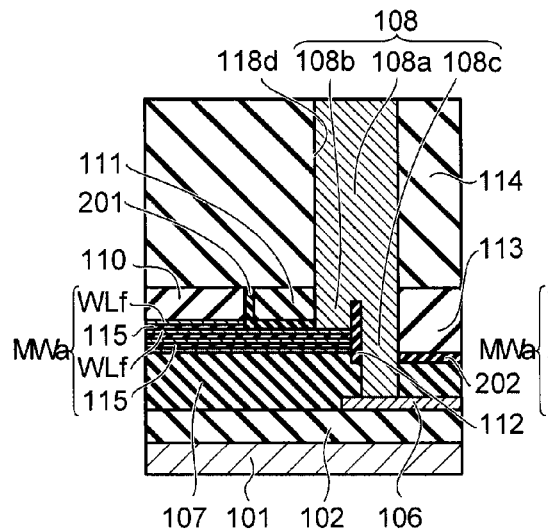
Figure 33D:
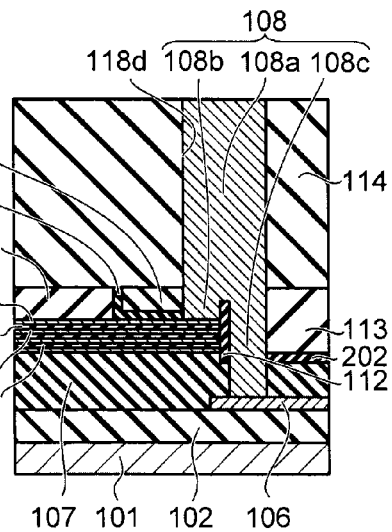

FIG. 32A and FIG. 33A are sectional views corresponding to the section along line C-C' shown in FIG. 13A. FIG. 32B and FIG. 33B are sectional views corresponding to the section along line D-D' shown in FIG. 13A. FIG. 32C and FIG. 33C are sectional views corresponding to the section along line E-E' shown in FIG. 13A. FIG. 32D and FIG. 33D are sectional views corresponding to the section along line F-F' shown in FIG. 13A.

First, similarly to the first embodiment, the process shown in FIG. 6A to FIG. 9D is performed.

Next, as shown in FIG. 25A to FIG. 25D, an insulating film 201a is formed of an insulating material containing silicon nitride on an intermediate structure shown in FIG. 8A and FIG. 8B and FIG. 9A to FIG. 9D. Thereafter, an insulating film 111a is formed of an insulating material containing silicon oxide on the insulating film 201a. Next, as shown in FIG. 26A to FIG. 26D, a flattening treatment such a CMP is performed to remove the insulating films 111a and 201a from above the interlayer insulating film 110. At this time, the insulating films 111a and 201a remain on the stepwise processed portion of the stacked body MWa. The remaining insulating film 111a becomes the insulating film 111. Beside, the remaining insulating film 201a becomes the insulating film 201. Incidentally, after the insulating film 111a on the interlayer insulating film 110 is removed by the flattening treatment, the exposed insulating film 201a may be removed by dry etching.

Next, in a memory area M, a memory hole passing through the interlayer insulating film 110 and an interelectrode insulating film 109 is formed between word lines WL and just above a lower layer bit line GBL. A gate insulating film GI is formed at a lower part on an inner surface of the memory hole, and a memory film 105 is formed at an upper part on the inner surface. Thereafter, a selection element SS is formed at a lower part in the memory hole, and a bit line BL is formed on the selection element SS.

Next, as shown in FIG. 27A to FIG. 27D, the insulating film 111, the insulating film 201 below the insulating film 111 and the stacked body MWa are partially removed by lithography and dry etching. In the Y-direction, after the insulating film 111 and the lower layer insulating film 201 are removed from the center part to the end, the exposed stacked body MWa is removed, so that a trench Th is formed. By this, an upper surface of the interlayer insulating film 107 is partially exposed in the trench Th.

Next, as shown in FIG. 28A to FIG. 28D, an insulating material containing silicon nitride is deposited on the whole surface, so that an insulating film 202a is formed. Thereafter, an insulating film 113a is formed of an insulating material containing silicon oxide on the insulating film 202a.

Next, as shown in FIG. 29A to FIG. 29D, a flattening treatment such as CMP is performed to remove the insulating films 202a and 113a from above the interlayer insulating film 110 and the insulating films 201 and 111. At this time, part of the insulating films 202a and 113a are made to remain in the trench Th.

By this, the insulating film 202a made to remain in the trench Th becomes an insulating film 202b, and the insulating film 113a becomes the insulating film 113. When viewed from the X-direction, the shape of the insulating film 202b is formed into an L shape.

Next, as shown in FIG. 30A to FIG. 30D, an insulating material containing silicon oxide is deposited on the interlayer insulating film 110, and the insulating films 201, 111, 202b and 113, so that the insulating film 114 is formed.

Next, as shown in FIG. 31A to FIG. 31D, part of the insulating films 114, 111 and 113 are etched by dry etching, so that a contact hole 118d is opened. At this time, the dry etching is performed under such a condition that the etching rate of a film containing silicon oxide is higher than that of a film containing silicon nitride. By this, the insulating films 201 and 202b are exposed. Accordingly, the insulating film 201 and 202b containing silicon nitride function as an etching stopper. Besides, by this dry etching, a portion of the insulating film 202b covering the side surface of the insulating film 111 is exposed in the contact hole 118d.

Next, as shown in FIG. 32A to FIG. 32D, part of the insulating films 201 and 202b on the bottom of the contact hole 118d are selectively removed by dry etching, and an upper surface of the electrode film WLf and an upper surface of the interlayer insulating film 107 are exposed. At this time, the condition of the dry etching is such that the film containing silicon nitride can be selectively removed. At the time point when the portions of the insulating films 201 and 202b arranged on the bottom surface of the contact hole 118d are removed, the etching is stopped. By this, a portion long in the Z-direction of the L-shaped insulating film 202b in the contact hole 118d is made to remain. By this, a part of the remaining insulating film 202b becomes the band-like insulating member 112 which rises from the silicon substrate 101 and extends in the X-direction. Besides, a portion remaining under the insulating film 113 becomes the insulating film 202. In the Z-direction, the upper surface of the insulating member 112 is formed at a position higher than the height of the upper surface of the stacked body ML and lower than the upper surface of the interlayer insulating film 110.

Next, as shown in FIG. 33A to FIG. 33D, contact plugs 108 are formed by embedding conductive material in the respective contact holes 118d. In a lower portion of the contact plug 108, a portion 108b is connected to an upper surface of the stepwise formed portion of the electrode film WLf. A portion 108c is connected to the lower layer interconnection 106.

By the above process, the memory device 200 of this embodiment is manufactured.

Incidentally, plural upper layer interconnections (not shown) may be formed on the respective contact plugs 108. Further, the insulating films 201 and 202 may be any film as long as the selection ratio to the film containing silicon oxide is obtained in the dry etching process, and may be a film containing an insulating material other than the silicon nitride. Further, the insulating films 201 and 202 may be made of materials different from each other. For example, the insulating film 201 may be formed of an insulating material containing alumina.

Next, effects of the embodiment will be described.

In the embodiment, the insulating films 201 and 202b function as the etching stoppers at the dry etching of forming the contact hole 118d. By this, even when the number of stacked layers is increased in order to improve the integration degree of the three-dimensional memory and the aspect ratio required in the contact processing becomes high, the controllability of the contact processing can be raised.

Effects other than the above are the same as those of the first embodiment.

Incidentally, in the respective embodiments and the modified examples thereof, the selection elements SS, the gate insulating films GI, the memory films 105 and the bit lines BL in the memory area M may be formed after the contact plugs 108 are formed in the word line lead-out area WLa (WLb). Besides, in the respective embodiments and the modified examples thereof, although the memory device including the resistance change element is exemplified, a three-dimensional stack-type semiconductor memory device may be adopted. That is, the semiconductor memory device may be such that a memory cell is provided at every intersection between a stacked body in which a conductive film and an insulating film are alternately stacked and a semiconductor pillar passing through the stacked body.

According to the embodiments described above, the memory device in which the manufacturing cost is reduced and the method for manufacturing the same can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A memory device comprising:
    a conductive member;
    a stacked body provided on the conductive member, the stacked body including a plurality of first interconnections being stacked to be separated from each other;
    a memory cell connected with one of the first interconnections;
    a plurality of contact plugs extending along a stacking direction of the stacked body, each of the contact plugs electrically connecting each of the first interconnections with an upper surface of the conductive member; and
    an insulating member covering a side surface of the stacked body,
    one of the contact plugs including
        an upper part, and
        a lower part provided between the upper part and the conductive member, the lower part including a first portion and a second portion, the first portion and the second portion being provided continuously from the upper part, the first portion and the second portion being disposed directly sandwiching the insulating member, the first portion and the second portion being separated by the insulating member in a direction crossing the stacking direction, the first portion being connected with one of the first interconnections, the second portion being connected with the conductive member, and
    a position of a top surface of the insulating member being higher than a position of the first interconnection of an uppermost layer of the stacked body.

2. The device according to claim 1, wherein a shape of the insulating member is a band shape extending in a direction along the side surface of the stacked body.

3. The device according to claim 2, wherein the stacked body has a staircase formed at every one of the first interconnections, the staircase being formed along a direction along the insulating member.

4. The device according to claim 3, further comprising an insulating film provided on a portion of upper surfaces of the first interconnections of the staircase,
    each of the contact plugs connecting each another portions of the upper surfaces of the first interconnections of the staircase.

5. The device according to claim 1, further comprising an insulating film provided on the first interconnections and around the contact plugs, the insulating film containing silicon oxide,
    the insulating member containing silicon nitride.

6. The device according to claim 1, further comprising a substrate,
    the conductive member being provided between the substrate and the stacked body.

7. The device according to claim 1, wherein the conductive member is a substrate.

8. A memory device comprising:
    a conductive member;
    a pillar provided on the conductive member and extending in a first direction,
    a plurality of first interconnections provided on the conductive member, the first interconnections being arranged as a stacked body in the first direction, the first interconnections extending in a second direction crossing the first direction, the first interconnections overlapping the pillar in a third direction crossing the first and the second directions;
    a plurality of memory cells, one of the memory cells being provided between one of the first interconnections and the pillar;
    a plurality of contact plugs extending along the first direction, one of the contact plugs electrically connecting one of the first interconnections with an upper surface of the conductive member; and
    an insulating member,
    one of the contact plugs including
        an upper part,
        a lower part provided between the upper part and the conductive member, the lower part including a first portion and a second portion, the first portion and the second portion being provided continuously from the upper part, the first portion and the second portion being disposed directly sandwiching the insulating member, the first portion and the second portion being separated by the insulating member in a direction crossing the first direction, the first portion being connected with one of the first interconnections, the second portion being connected with the conductive member, and
    the insulating member covering a side surface of the stacked body, a position of a top surface of the insulating member being higher than a position of the first interconnection of an uppermost layer of the stacked body.

9. The device according to claim 8, wherein a shape of the insulating member is a band shape extending in a direction along the side surface of the stacked body.

10. The device according to claim 9, wherein the stacked body has a staircase formed at every one of the first interconnections, the staircase being formed along a direction along the insulating member.

11. The device according to claim 10, further comprising an insulating film provided on a portion of upper surfaces of the first interconnections of the staircase,
    each of the contact plugs connecting each another portions of the upper surfaces of the first interconnections of the staircase.

12. The device according to claim 8, further comprising an insulating film provided on the first interconnections and around the contact plugs, the insulating film containing silicon oxide,
    the insulating member containing silicon nitride.

13. The device according to claim 8, further comprising a substrate,
    the conductive member being between the substrate and the stacked body.

14. The device according to claim 8, wherein the conductive member is a substrate.

15. The device according to claim 8, further comprising a substrate provided under the conductive member,
    the first direction is perpendicular to a major surface of the substrate, and
    the contact plugs extending in the first direction.

16. A method for manufacturing a memory device, a memory area and a lead-out area being set in the memory device, the method comprising:
    forming a stacked body on a conductive member, the stacked body including a plurality of electrode films and a plurality of inter-electrode insulating films, the plurality of electrode films and the plurality of inter-electrode insulating films being alternately stacked;
    exposing an upper surface of the electrode films in the lead-out area;
    forming memory cells in the memory area;

forming an insulating member on a side surface of an end of the stacked body in the lead-out area, the insulating member covering the side surface of the end of the stacked body, a position of a top surface of the insulating member being higher than a position of the electrode film of an uppermost layer of the stacked body;

forming a first insulating film on the stacked body and the conductive member by using a material different from the insulating member, forming a contact hole by removing a part of the first insulating film and leaving at least a part of the insulating member, the part of the first insulating film being positioned above the insulating member in the first insulating film; and embedding a conductive material in the contact hole.

17. The method according to claim 16, wherein the insulating member is formed of a material containing silicon nitride, and the first insulating film is formed of a material containing silicon oxide.

18. The method according to claim 16, wherein the conductive member is an interconnection.

19. The method according to claim 16, wherein the conductive member is a substrate.

20. The method according to claim 16, wherein the exposing includes forming a step at an end of the stacked body by removing a part of the end of the stacked body.

* * * * *